(12) United States Patent
Guo et al.

(10) Patent No.: US 12,310,100 B2
(45) Date of Patent: May 20, 2025

(54) DIELECTRIC REFLOW FOR BOUNDARY CONTROL

(71) Applicant: International Business Machines Corporation, Armonk, NY (US)

(72) Inventors: Jing Guo, Niskayuna, NY (US); Ekmini Anuja De Silva, Slingerlands, NY (US); Nicolas Loubet, Guilderland, NY (US); Indira Seshadri, Niskayuna, NY (US); Ruqiang Bao, Niskayuna, NY (US); Nelson Felix, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 659 days.

(21) Appl. No.: 17/537,562

(22) Filed: Nov. 30, 2021

(65) Prior Publication Data
US 2023/0170348 A1     Jun. 1, 2023

(51) Int. Cl.
| H01L 21/02 | (2006.01) |
| H10D 30/01 | (2025.01) |
| H10D 30/62 | (2025.01) |
| H10D 84/01 | (2025.01) |
| H10D 84/03 | (2025.01) |
| H10D 84/83 | (2025.01) |

(52) U.S. Cl.
CPC ......... *H10D 84/834* (2025.01); *H10D 30/024* (2025.01); *H10D 30/62* (2025.01); *H10D 84/0158* (2025.01); *H10D 84/038* (2025.01); *H01L 21/0262* (2013.01)

(58) Field of Classification Search
CPC ............ H10D 84/834; H10D 84/0158; H10D 30/024; H10D 84/038; H10D 30/62; H01L 21/0262
USPC ......................................................... 257/401
See application file for complete search history.

(56) References Cited

U.S. PATENT DOCUMENTS

| 5,612,252 A * | 3/1997 | Lur ................. H01L 21/76804 438/618 |
| 6,180,511 B1 * | 1/2001 | Kim ................. H01L 21/76852 438/626 |
| 8,871,651 B1 | 10/2014 | Choi et al. |
| 9,177,874 B2 | 11/2015 | Patzer et al. |
| 10,008,418 B2 | 6/2018 | Yu et al. |
| 10,090,306 B2 | 10/2018 | Li |
| 10,236,293 B2 | 3/2019 | Basker et al. |
| 10,304,815 B2 | 5/2019 | Clevenger et al. |
| 10,332,746 B1 | 6/2019 | Yu et al. |
| 10,361,199 B2 | 7/2019 | Balakrishnan et al. |
| 10,388,510 B2 | 8/2019 | De Silva et al. |

(Continued)

*Primary Examiner* — Ori Nadav
(74) *Attorney, Agent, or Firm* — CANTOR COLBURN LLP; Samuel Waldaum

(57) ABSTRACT

Embodiments of the invention include a dielectric reflow technique for boundary control in which a first layer is deposited on a first transistor region and a second transistor region, the first and second transistor regions being adjacent. A dielectric layer is formed to protect the second transistor region such that the first transistor region is exposed, the dielectric layer bounded at a first location. In response to removing a portion of the first layer on the first transistor region, the dielectric layer protecting the second transistor region is reflowed such that at least a reflowed portion of the dielectric layer extends beyond the first location.

10 Claims, 38 Drawing Sheets

(56) References Cited

U.S. PATENT DOCUMENTS

2014/0256145 A1 9/2014 Abdallah et al.
2018/0294192 A1* 10/2018 Bao .................... H10D 84/0195

* cited by examiner

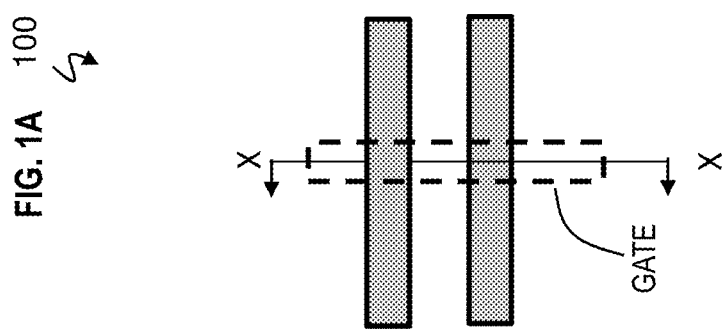

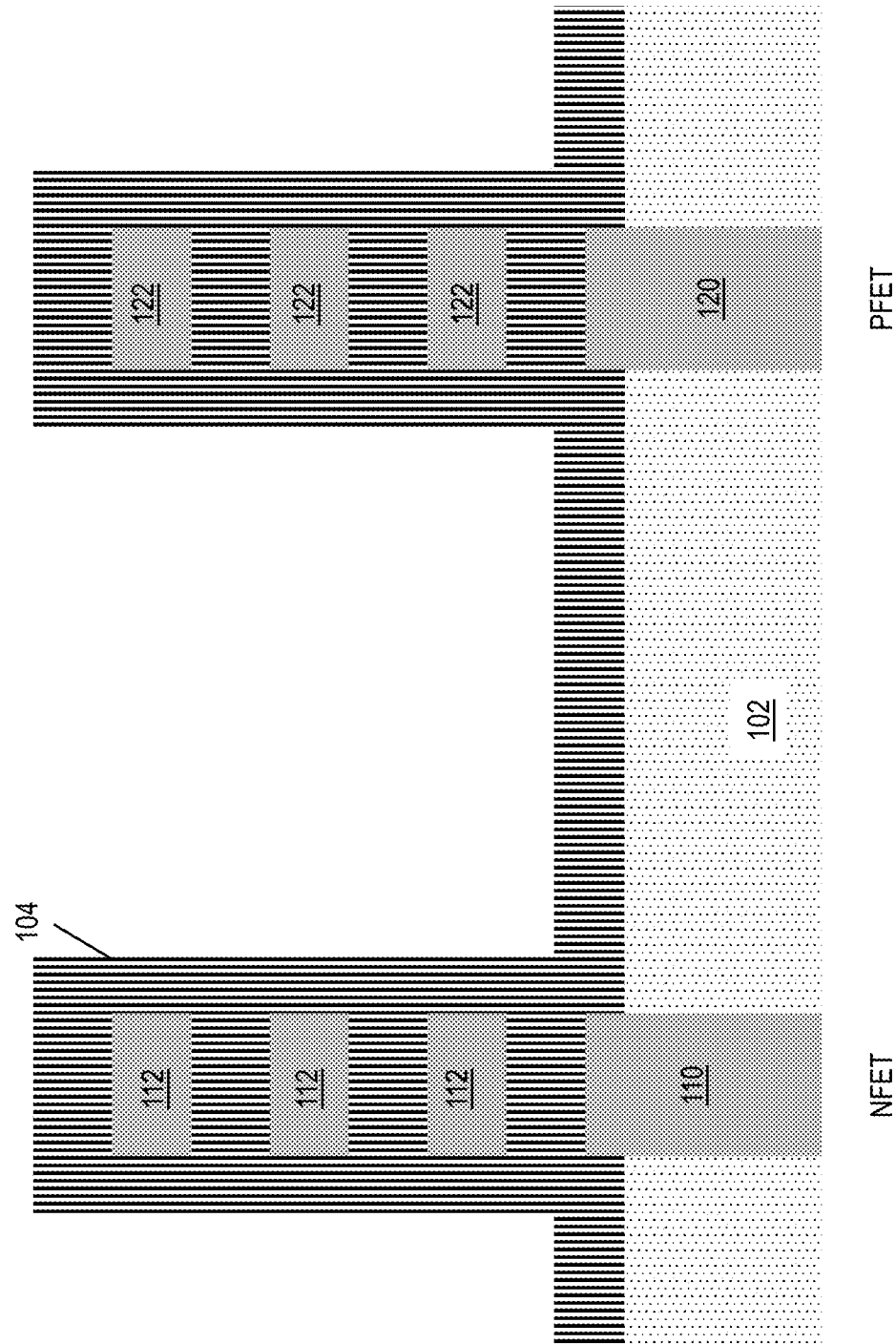

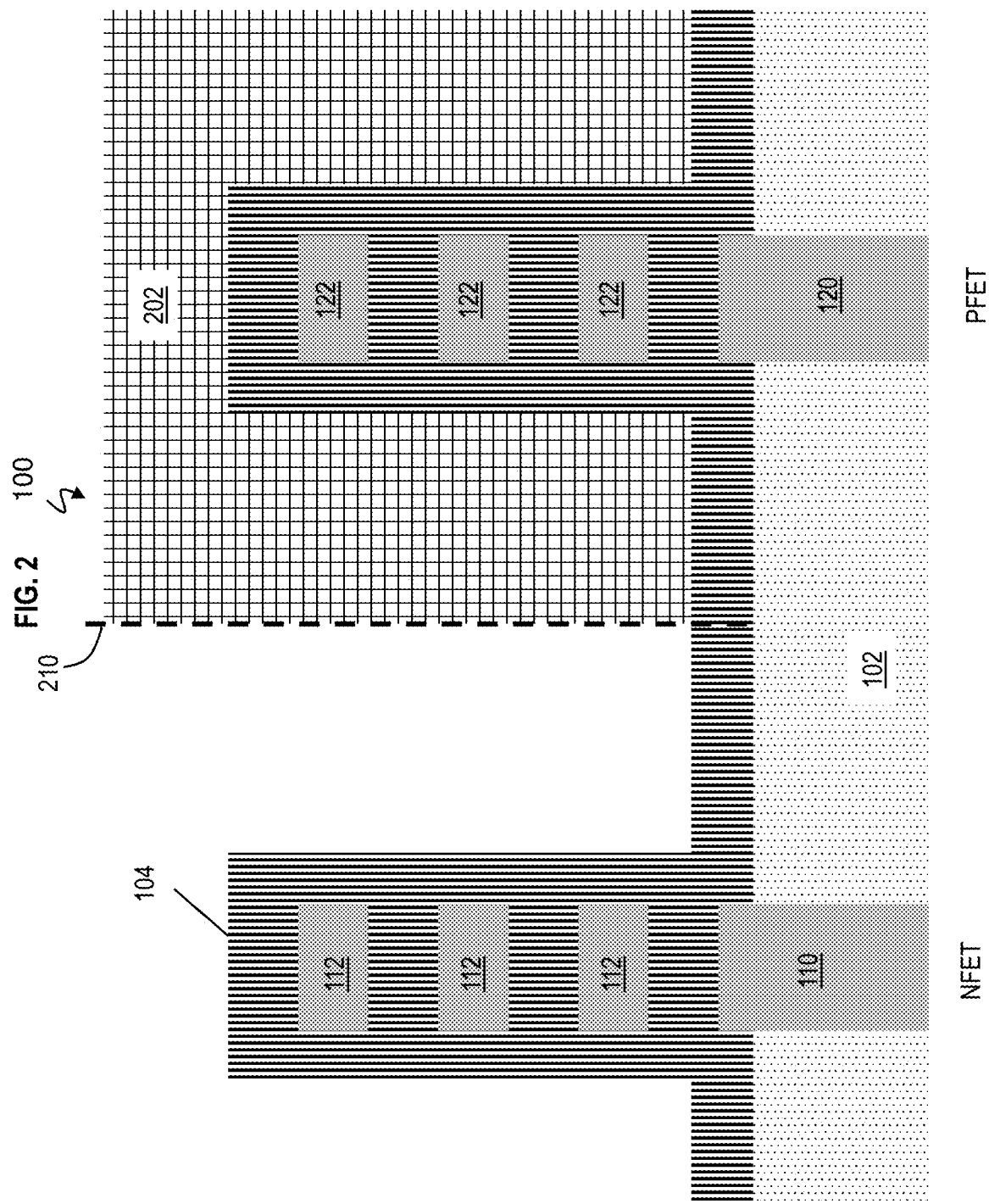

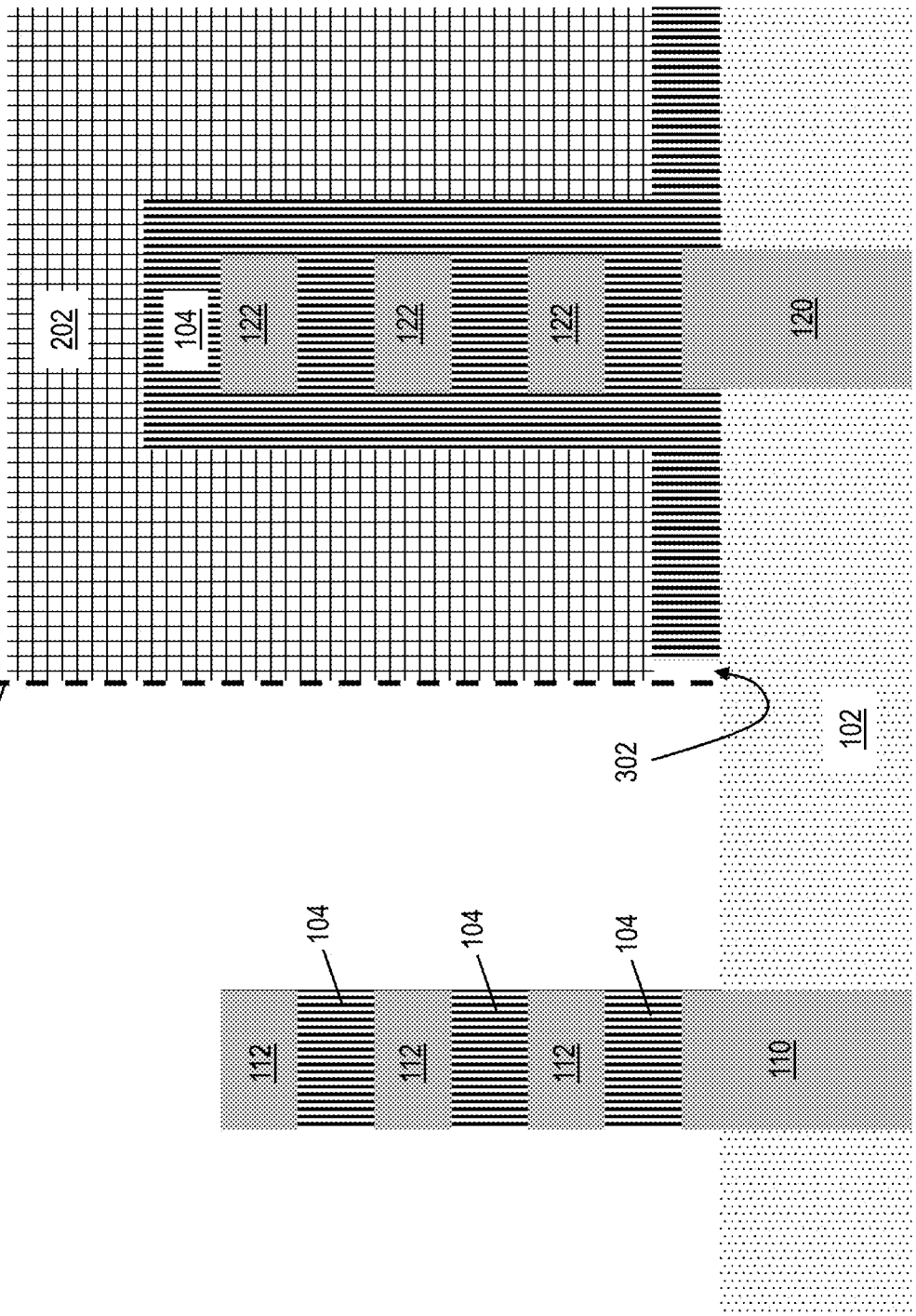

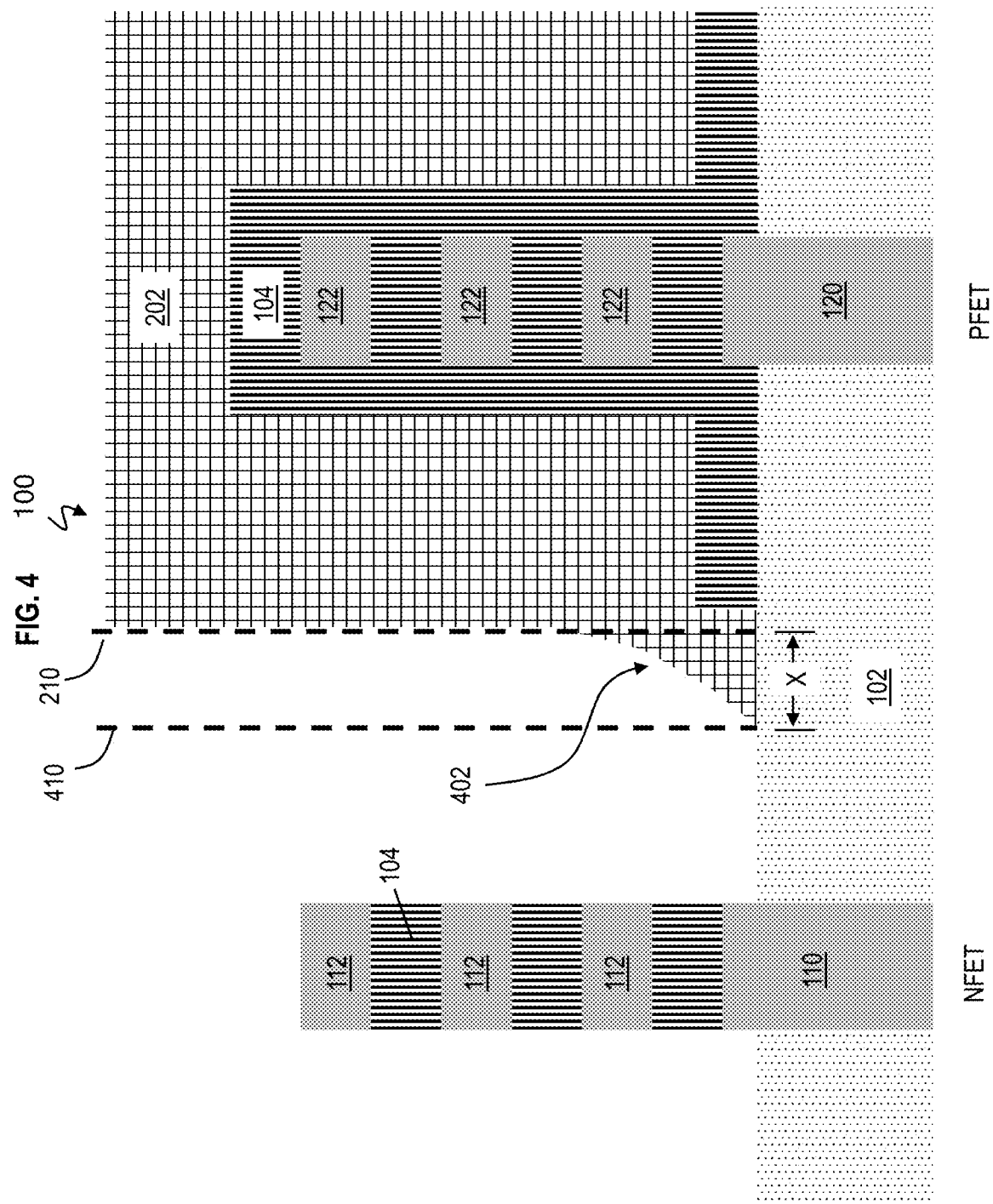

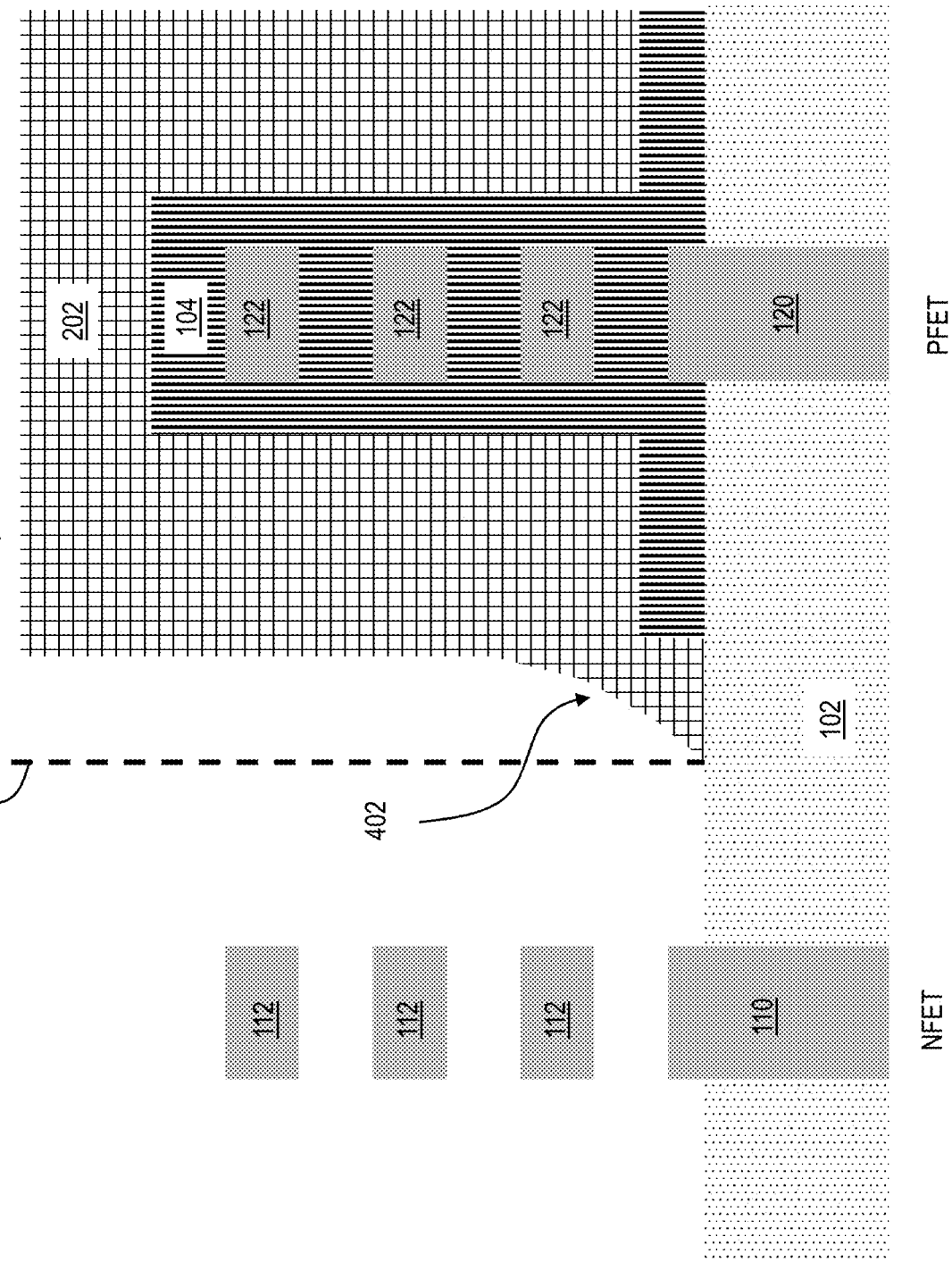

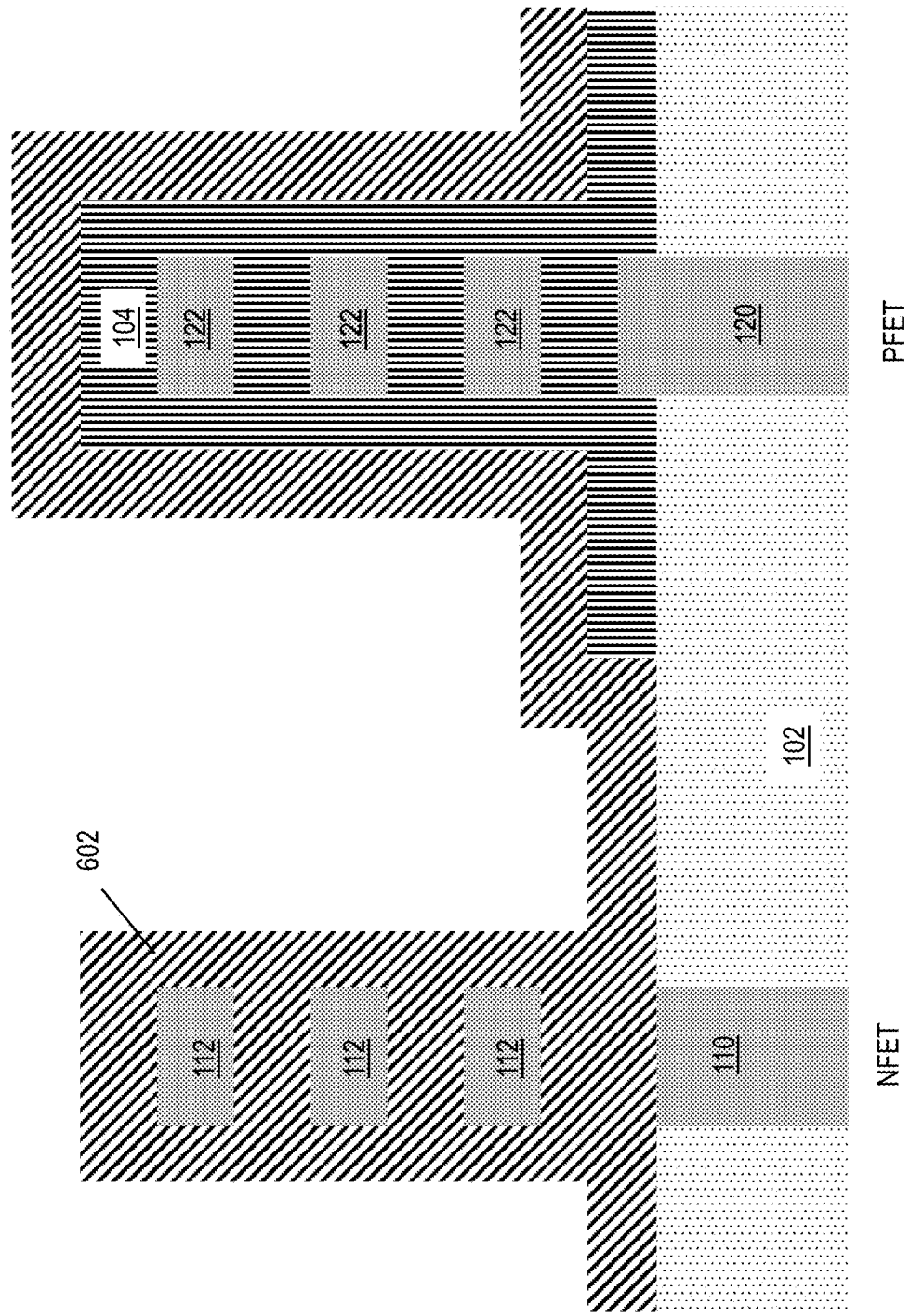

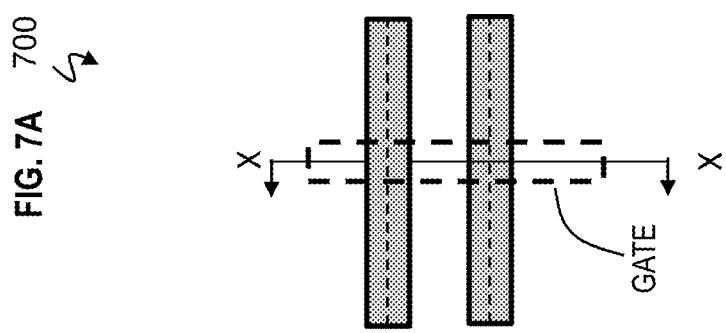

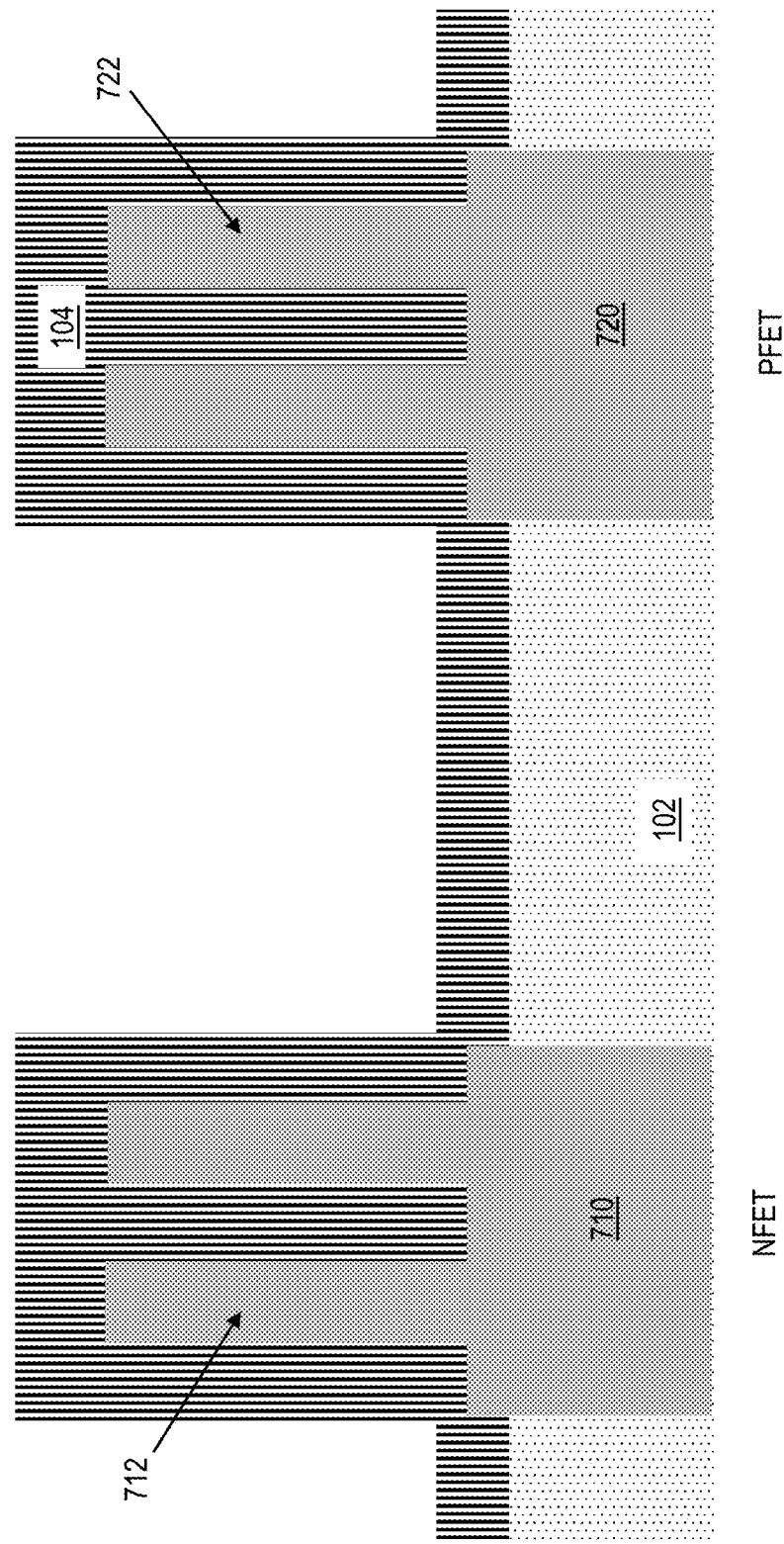

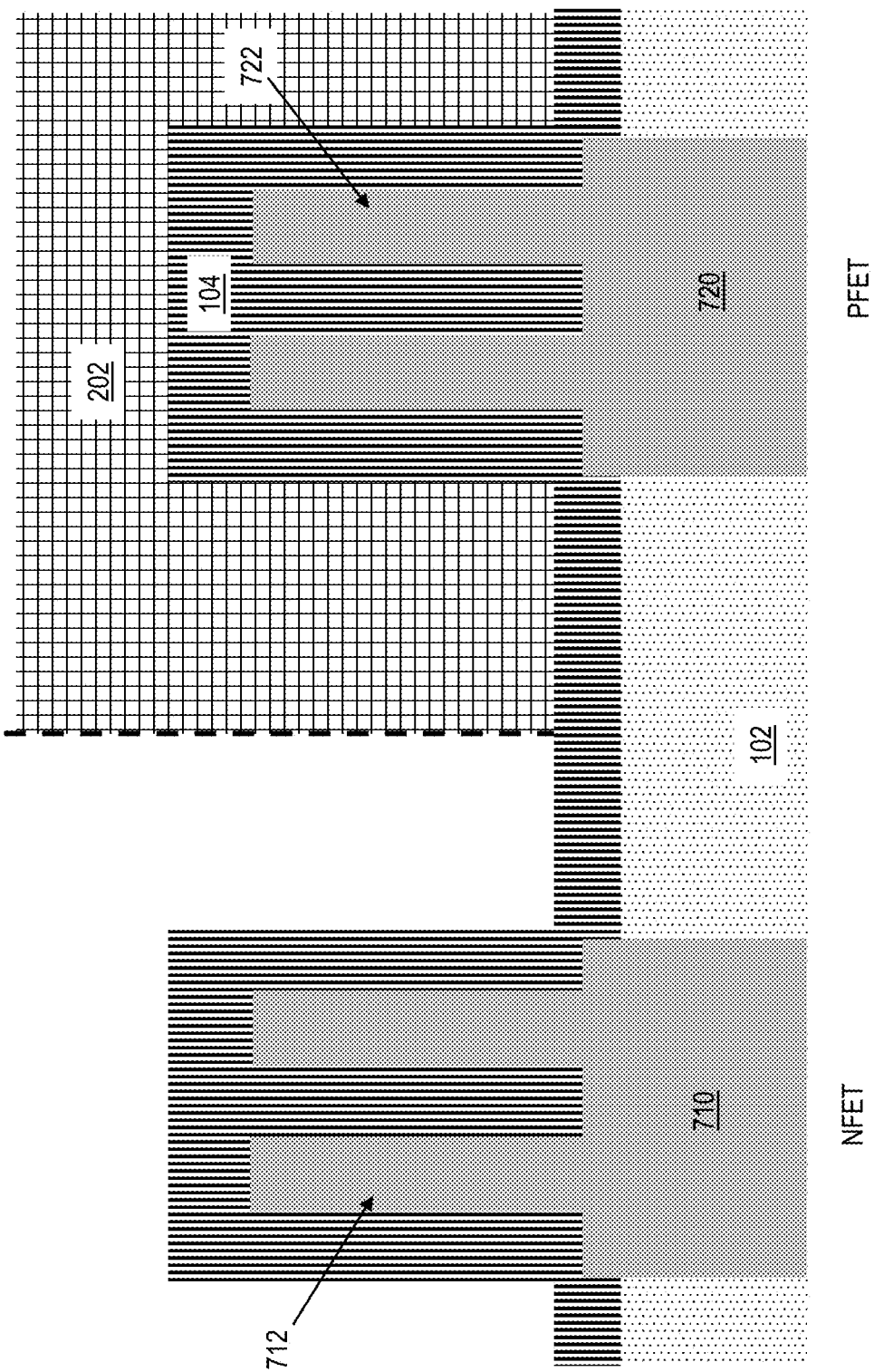

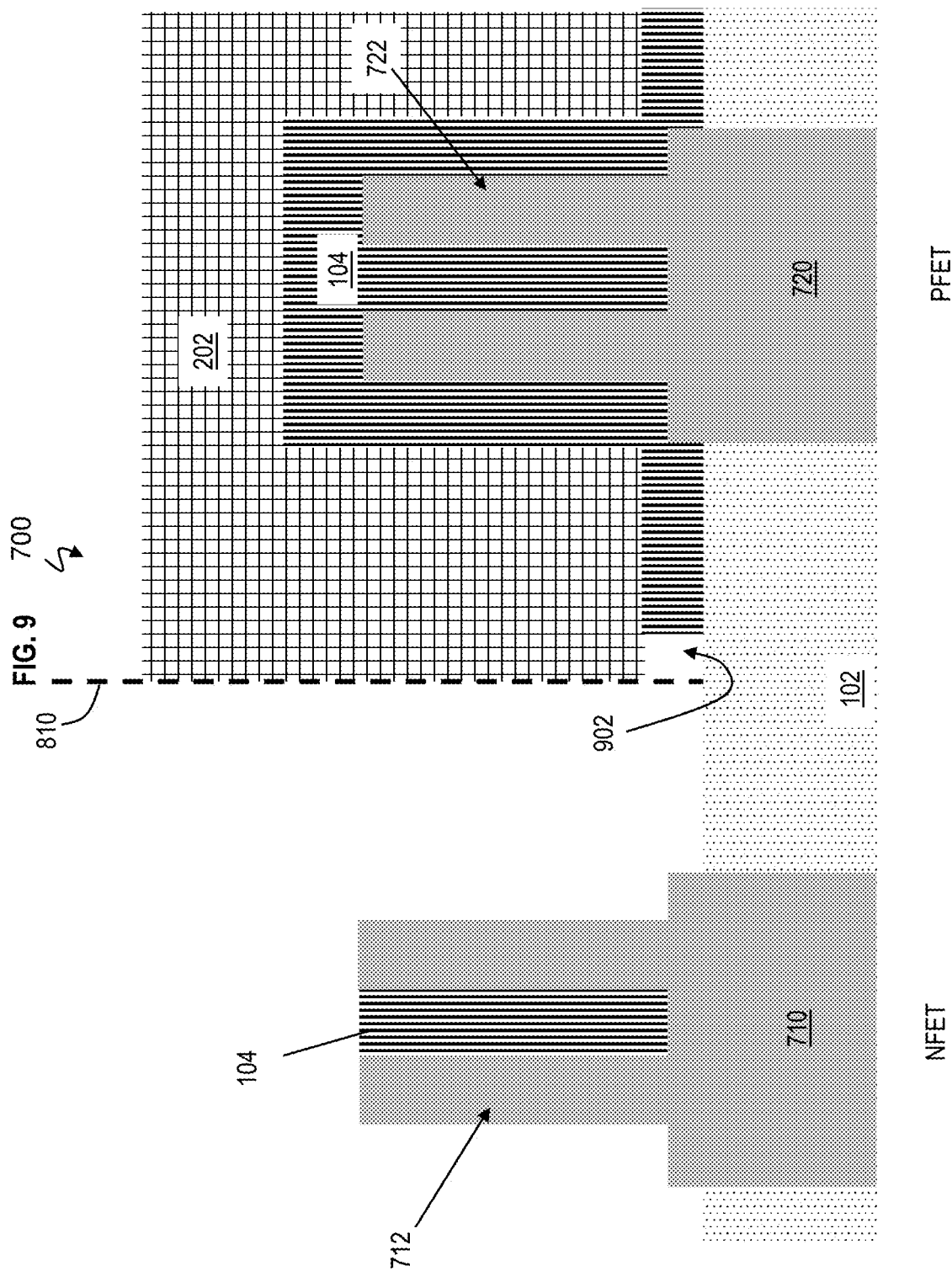

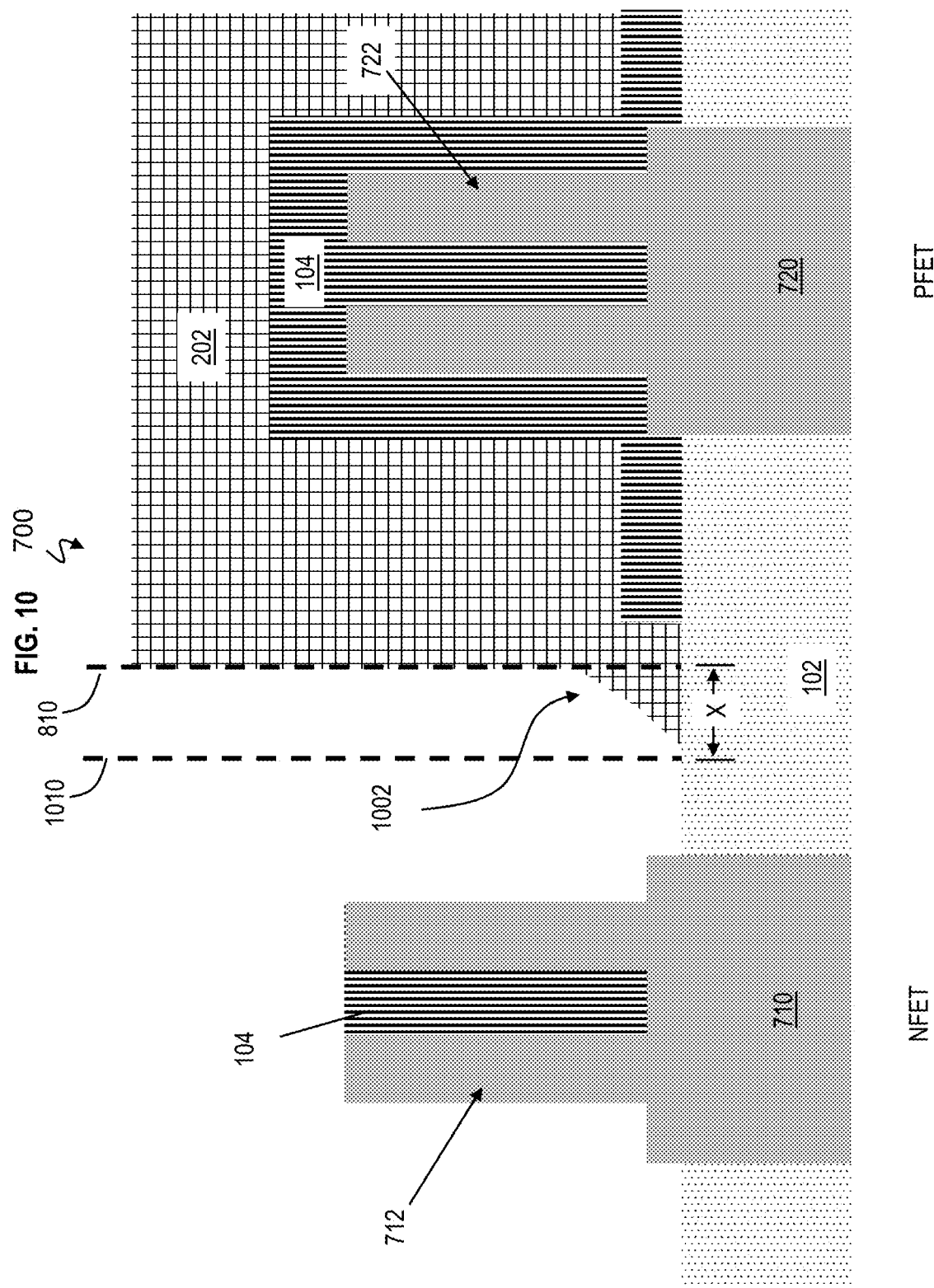

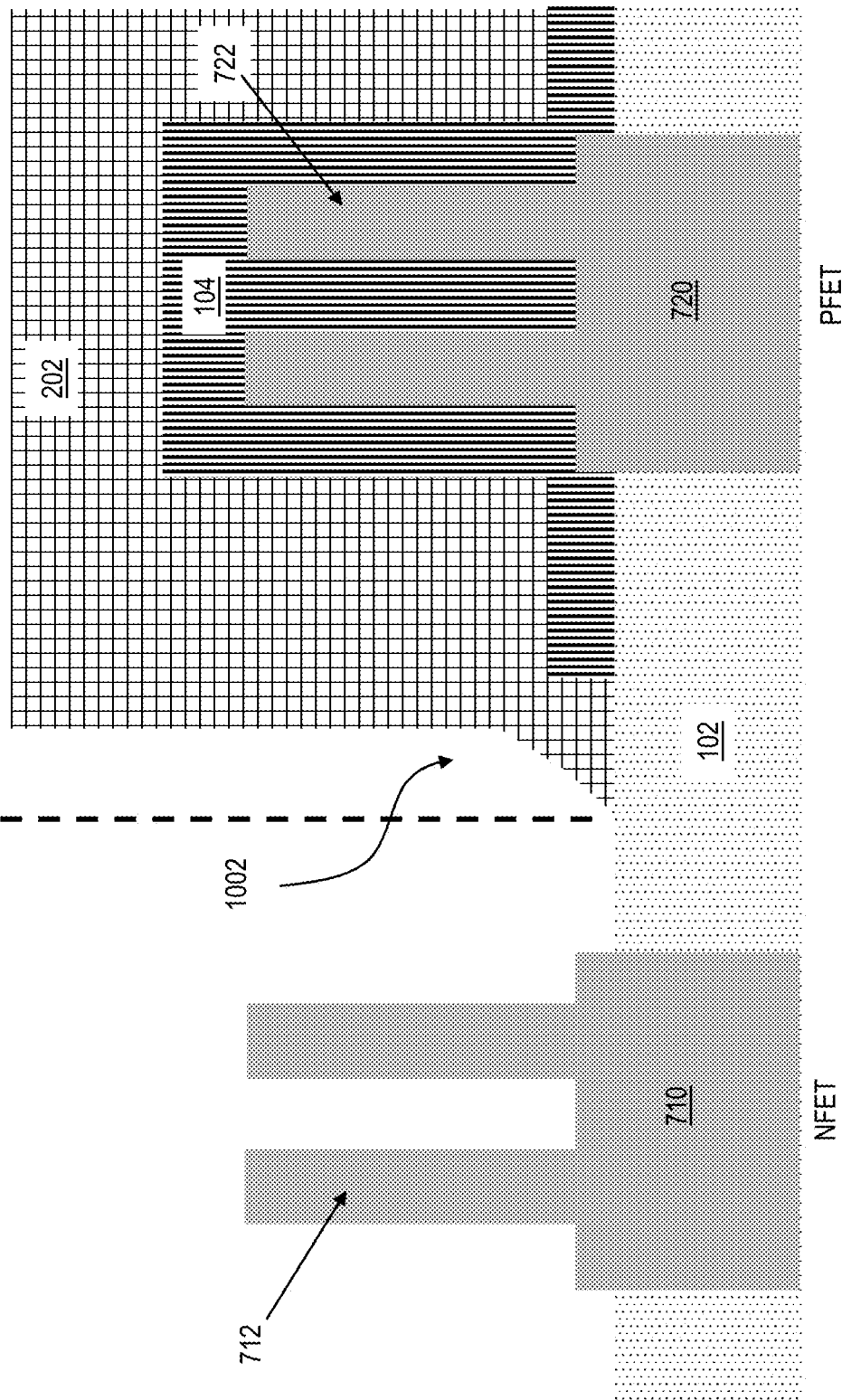

FIG. 34
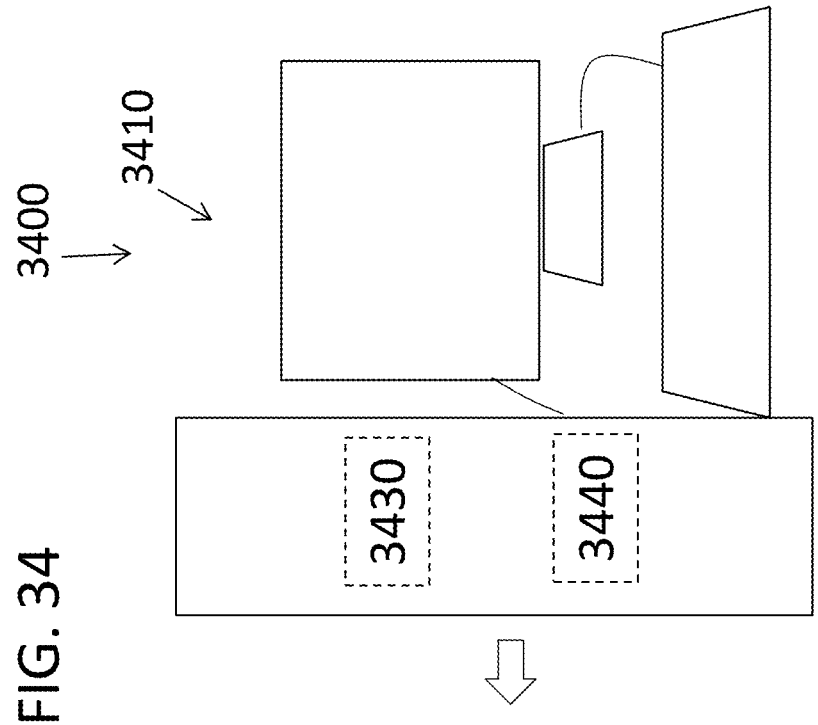
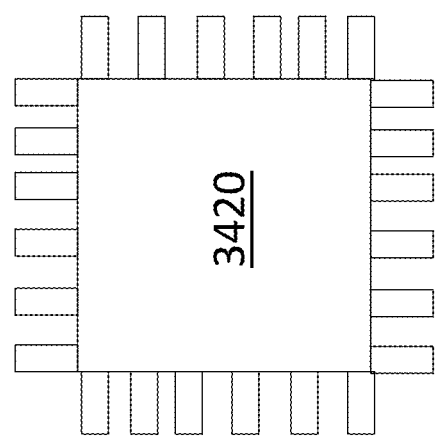

DIELECTRIC REFLOW FOR BOUNDARY CONTROL

BACKGROUND

The present invention generally relates to fabrication methods and resulting structures for integrated circuits, and more specifically, to fabrication methods and resulting structures configured and arranged to implement a dielectric reflow technique for boundary control.

A metal-oxide-semiconductor field-effect transistor (MOSFET) is a transistor used for amplifying or switching electronic signals. The MOSFET has a source, a drain, and a metal oxide gate electrode. A conventional FET is a planar device where the entire channel region of the device is formed parallel and slightly below the planar upper surface of the semiconducting substrate. In contrast to a planar FET, there are so-called three-dimensional (3D) devices, such as a FinFET device, which is a three-dimensional structure. One type of device that shows promise for advanced integrated circuit products of the future is generally known as a nanosheet transistor. In general, a nanosheet transistor has a fin-type channel structure that includes of a plurality of vertically spaced-apart sheets of semiconductor material. A gate structure for the device is positioned around each of these spaced-apart layers of channel semiconductor material.

SUMMARY

Embodiments of the present invention are directed to a method for a dielectric reflow technique for boundary control. A non-limiting example method includes depositing a first layer on a first transistor region and a second transistor region, where the first and second transistor regions are adjacent. The method includes forming a dielectric layer to protect the second transistor region such that the first transistor region is exposed. The dielectric layer is bounded at a first location. The method includes, responsive to removing a portion of the first layer on the first transistor region, reflowing the dielectric layer protecting the second transistor region such that at least a reflowed portion of the dielectric layer extends beyond the first location.

Embodiments of the present invention are directed to a method that includes depositing a first layer on a first transistor region and a second transistor region. The first transistor region includes first transistors, and the second transistor region includes second transistors. The method includes forming a block layer to protect one of the first transistors and forming a block layer stack to protect one of the second transistors. The method includes, responsive to removing a portion of the first layer on an unprotected one of the first transistors and on an unprotected one of the second transistors, reflowing the block layer protecting the one of the first transistors and the block layer stack protecting the one of the second transistors.

Embodiments of the present invention are directed to a reflow method that includes forming a first layer on a first region and a second region. The first layer fills a first cavity in the first region and a second cavity in a second region. The method includes forming a block layer to cover the second region, while the first region is exposed. The method includes, responsive to removing a portion of the first layer on the first region, reflowing the block layer covering the second region such that at least a reflowed portion of the block layer extends toward the first region. The method includes removing a remainder portion of the first layer on the first region, such that the first cavity is empty. Also, the method includes, responsive to removing the block layer, depositing a second layer so as to fill the first cavity, and etching back the first and second layers.

Other embodiments of the present invention implement features of the above-described methods in structures/devices.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 1A depicts a top view of a simplified illustration of a portion of an integrated circuit (IC) which is implemented using dielectric reflow techniques for boundary control according to one or more embodiments of the invention;

FIG. 1B depicts a cross-sectional view of a portion of an IC under-fabrication after fabrication operations according to one or more embodiments of the invention;

FIG. 2 depicts a cross-sectional view of a portion of an IC under-fabrication after fabrication operations according to one or more embodiments of the invention;

FIG. 3 depicts a cross-sectional view of a portion of an IC under-fabrication after fabrication operations according to one or more embodiments of the invention;

FIG. 4 depicts a cross-sectional view of a portion of an IC under-fabrication after fabrication operations according to one or more embodiments of the invention;

FIG. 5 depicts a cross-sectional view of a portion of an IC under-fabrication after fabrication operations according to one or more embodiments of the invention;

FIG. 6 depicts a cross-sectional view of a portion of an IC under-fabrication after fabrication operations according to one or more embodiments of the invention;

FIG. 7A depicts a top view of a simplified illustration of a portion of an IC which is implemented using dielectric reflow techniques for boundary control according to one or more embodiments of the invention;

FIG. 7B depicts a cross-sectional view of a portion of an IC under-fabrication after fabrication operations according to one or more embodiments of the invention;

FIG. 8 depicts a cross-sectional view of a portion of an IC under-fabrication after fabrication operations according to one or more embodiments of the invention;

FIG. 9 depicts a cross-sectional view of a portion of an IC under-fabrication after fabrication operations according to one or more embodiments of the invention;

FIG. 10 depicts a cross-sectional view of a portion of an IC under-fabrication after fabrication operations according to one or more embodiments of the invention;

FIG. 11 depicts a cross-sectional view of a portion of an IC under-fabrication after fabrication operations according to one or more embodiments of the invention;

FIG. 34 is a block diagram of a system to design/layout a portion of an IC that uses reflow techniques for boundary control in accordance with one or more embodiments of the present invention.

DETAILED DESCRIPTION

Figure 12:
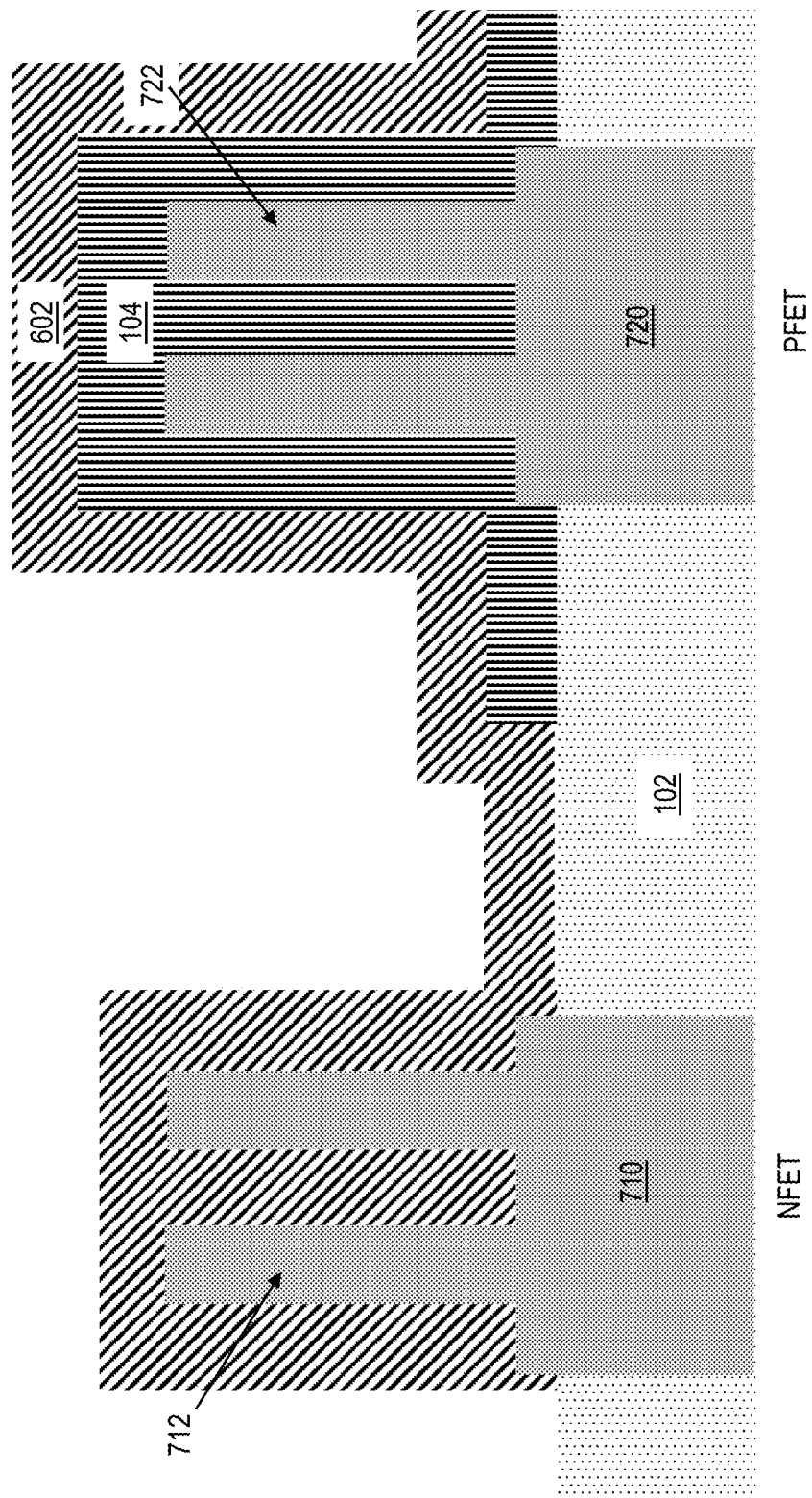
FIG. 12 depicts a cross-sectional view of a portion of an IC under-fabrication after fabrication operations according to one or more embodiments of the invention.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Complementary metal-oxide-semiconductor field-effect transistor device technology has been the dominant very large scale integrated (VLSI) technology used to form ICs. Following Moore's law has been the driving force for the improvement of speed and shrinkage of chip area of ICs. MOSFET device dimensions continue to be aggressively scaled to satisfy the high demand for improving circuit performance with decreased power and increased integration density. In MOSFET devices, adjacent p-type field-effect transistors (PFET) and n-type field-effect transistors (NFET) use different types of work function materials. PFETs use p-type work function materials, while NFETs use n-type work function materials, thereby creating an n-type/p-type (N/P) boundary between the NFET and PFET. Because of scaling, tight fin pitch N/P boundary protection has become an issue due to edge placement accuracy. Inaccurate edge placement leads to removal of material from blocked regions.

One or more embodiments of the present invention provide a dielectric reflow technique for boundary control at the N/P boundary of n-type and p-type transistors. A technique for protecting an N/P boundary between an n-type doped field-effect transistor region and a p-type doped field-effect transistor region in a semiconductor device may include conformally depositing a first work function material over channel structures provided in the NFET region and the PFET region, and depositing and patterning a dielectric layer to block the channel structures in a selected one of the NFET region and the PFET region. The dielectric layer is reflowed to increase the boundary and/or protection of the selected region, thereby causing an extended portion of the dielectric layer covering the selected region to extend further toward the non-selected region. Etching is performed to remove the first work function material from the non-selected region while the selected region is protected, and the extended portion of the reflowed dielectric layer prevents the etching from undercutting the dielectric layer to remove any of the protected work function material. The dielectric layer is removed from the selected region, and one or more additional work function materials are deposited on the selected and non-selected regions.

Turning now to a more detailed description of aspects of the present invention, FIG. 1A depicts a top view of a simplified illustration of a portion of an integrated circuit (IC) 100 according to one or more embodiments of the invention. As depicted in FIG. 1A, an "X-X" view is taken along an axial length of the gate structure. FIGS. 1B-6 depict cross-sectional views of a portion of an IC 100 along the X-X view after fabrication operations according to one or more embodiments of the invention. FIGS. 1B-6 can apply dielectric reflow techniques for boundary control to nanosheet and/or nanowire structures. Standard semiconductor fabrication techniques can be utilized to fabricate IC 100 as understood by one of ordinary skill in the art. Moreover, any suitable deposition techniques and etching techniques can be utilized herein.

FIG. 1B depicts a cross-sectional view of a portion of the IC 100 after fabrication operations according to one or more embodiments of the invention. FIG. 1B illustrates the IC 100 after replacement metal gate (RMG) formation has been performed. In FIG. 1B, an NFET side may have a base portion 110 and PFET side may have a base portion 120 in a lower-level material 102. Lower-level material 102 can be an oxide such as silicon dioxide, etc. Lower-level material 102 can be formed on top of one or more other layers (not shown) such as a substrate. Base portions 110, 120 can be a semiconductor material such as silicon. In one or more embodiments, base portions 110, 120 may not be present.

The NFET side has nanosheet layers 112 as the channel regions of the transistor, while the PFET side has nanosheet layers 122 as the channel regions. Channel regions are connected to source/drain regions (not shown) as understood by one of ordinary skill in the art. Nanosheet layers 112, 122 are semiconductor layers. Example materials of nanosheet layers 112, 122 may include substantially pure silicon, etc. In one or more embodiments, the thicknesses of nanosheet layers 112, 122 may be about the same. In one or more embodiments, the thicknesses of nanosheet layers 112, 122 may vary depending upon the particular application and they need not have the same thicknesses.

During the RMG process, a high-k dielectric material (not shown for conciseness) is formed to wrap around nanosheet layers 112, 122. Subsequently, a work function material 104 is formed on both the NFET side and PFET side of the IC 100 as depicted in FIG. 1B. In FIG. 1B, work function material 104 can be a p-type work function material such as titanium nitride, titanium carbide (doped with aluminum), etc. The thickness of work function material 104 may range from about 1-10 nanometers (nm). Further information regarding high-k dielectric materials and work function materials (metals) is discussed below.

Techniques for forming high-k metal gate (HKMG) in gate openings are well-known in the art and, thus, the details have been omitted in order to allow the reader to focus on the salient aspects of the disclosed methods. However, it should be understood that such HKMG will generally include formation of one or more gate dielectric layers (e.g., a high-k gate dielectric layer), which are deposited so as to line the gate openings, and formation of one or more metal layers, which are deposited onto the gate dielectric layer(s) so as to fill the gate openings. The materials and thicknesses of the dielectric and metal layers used for the HKMG can be preselected to achieve desired work functions given the conductivity type of the FET. To avoid clutter in the drawings and to allow the reader to focus on the salient aspects of the disclosed methods, the different layers within the HKMG stack are not illustrated. For explanation purposes, a high-k gate dielectric layer can be, for example, a dielectric material with a dielectric constant that is greater than the dielectric constant of silicon dioxide (i.e., greater than 3.9). Exemplary high-k dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). Optionally, the metal layer(s) can include a work function metal that is immediately adjacent to the gate dielectric layer and that is preselected in order to achieve an optimal gate conductor work function given the conductivity type of the nanosheet-FET. For example, the optimal gate conductor work function for the PFETs can be, for example, between about 4.9 eV and about 5.2 eV. Exemplary metals (and metal alloys) having a work function within or close to this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). The optimal gate conductor work function for NFETs can be, for example, between 3.9 eV and about 4.2 eV. Exemplary metals (and metal alloys) having a work function within or close to this range include, but are not limited to, hafnium, zirconium, titanium, tantalum, aluminum, and alloys thereof, such as, hafnium carbide, zirconium carbide, titanium carbide, tantalum carbide, and aluminum carbide. The metal layer(s) can further include a fill metal or fill metal alloy, such as tungsten, a tungsten alloy (e.g., tungsten silicide or titanium tungsten), cobalt, aluminum or any other suitable fill metal or fill metal.

FIG. 2 depicts a cross-sectional view of a portion of the IC 100 after fabrication operations according to one or more embodiments of the invention. FIG. 2 illustrates deposition and patterning of a dielectric layer 202 for protecting the PFET side. Dielectric layer 202 (including block layer 1302 in FIG. 13 and block layer 1502 in FIG. 15) could be organic or inorganic; dielectric layer 202 could be deposited by spin on or deposited through physical vapor deposition (PVD), chemical vapor deposition (CVD), atomic layer deposition (ALD), or a combination of such deposition methods. Dielectric layer 202 could be and/or substituted for an organic layer such as an organic planarization layer (OPL), spin on carbon, amorphous carbon, etc. Dielectric layer 202 may be an inorganic layer such as a flowable oxide, SiCOH type low-k materials, spin on metal oxides such as $TiO_x$, $WO_x$, $TaO_x$, $ZrO_x$, etc.), etc. In one or more embodiments, organic layers are excluded. Organic layers consist of purely carbon, hydrogen, oxygen (CHO) and can be converted to ash (carbon) through a plasma exposure. Inorganic layers may have some organic content but consist of additional metal/dielectric elements like Si, Ti, W, Zr, etc.

The edge of dielectric layer 202 creates an N/P boundary line 210 between the NFET and PFET sides as depicted by the dashed boundary line 210. Low temperature baking of dielectric layer 202 is performed. An example range of temperatures for low temperature baking of dielectric layer 202 may include 100-250 Celsius (C); low temperature baking stabilizes the material to enable performing a wet or dry etch to remove portions of this layer in the next fabrication operation.

FIG. 3 depicts a cross-sectional view of a portion of the IC 100 after fabrication operations according to one or more embodiments of the invention. FIG. 3 illustrates removal of exposed portions of work function material 104. The etching of work function material 104 undercuts dielectric layer 202, thereby etching and exposing a lower portion of work function material 104 in gap/opening 302. A wet etch chemistry or dry etch chemistry may be used. In one or more embodiments, an example wet etch may be an etchant using RT standard clean 1 (SC1) for 2 minutes, followed by hot $H_2O_2$ for 10 minutes, followed by RT SC1 for 2 minutes. The SC1 clean process uses the APM solution (ammonia hydroxide-hydrogen peroxide water mixture) of the RCA cleaning method. The RCA clean is a standard set of wafer cleaning operations which are performed before high-temperature processing operations. In one or more embodiments, an example wet etch may by RT SC1 for 2 minutes followed by hot SC2 for 5 minutes. The SC2 cleaning method uses a solution that is typically made up of 6 parts deionized water, 1 part hydrochloric acid, and 1 part hydrogen peroxide or HPM (hydrochloric/peroxide mixture).

FIG. 4 depicts a cross-sectional view of a portion of the IC 100 after fabrication operations according to one or more embodiments of the invention. FIG. 4 depicts dielectric layer reflow. In order to reflow dielectric layer 202, dielectric layer 202 can be heated to a temperature ranging from about 100-600° C. In one or more embodiments, reflowing dielectric layer 202 includes heating dielectric layer 202 to a temperature to decrease viscosity of dielectric layer 202, which then enables the film of dielectric material to flow in a controlled manner. In one or more embodiments, reflowing dielectric layer 202 included exposing the dielectric material of dielectric layer 202 to ultraviolet (UV) radiation (and thermal energy, i.e., increased temperatures) to decrease viscosity of dielectric layer 202, which then enables the film of dielectric material to flow in a controlled manner. In one or more embodiments, the reflow of dielectric layer 202 can be controlled by the percentage of crosslinking in the dielectric material of dielectric layer 202, in the case of spin on metal oxides and low-k silicon films. In some cases, a de-crosslinking treatment through exposure to ultraviolet light that breaks cross-link bonds and reduces the percentage of crosslinking may be used prior to exposure to temperature and/or pressure for reflow. In one or more embodiments, the reflow of dielectric layer 202 can be controlled by the temperature, gas flow, and pressure applied to the dielectric layer 202, such as in the case of flowable oxide. For example, a temperature of about 250-400° C. with about 1 atmosphere of pressure can be utilized to reflow dielectric layer 202.

Reflow of dielectric layer 202 results in an extended dielectric portion 402 of dielectric layer 202, where extended dielectric portion 402 has a new boundary line 410. As can be seen in FIG. 4, boundary line 410 of extended dielectric portion 502 is closer to the NFET side than and extends beyond boundary line 210. For example, extended dielectric portion 402 can be a distance of "X" closer to the NFET side than the previous boundary line 210 of dielectric layer 202, thereby providing additional protection against undercutting dielectric layer 202 in subsequent etching of work function material 104 that is between nanosheet layers 112.

FIG. 5 depicts a cross-sectional view of a portion of the IC 100 after fabrication operations according to one or more embodiments of the invention. FIG. 5 illustrates full removal of work function material 104 in the NFET region while work function material 104 is protected by reflowed dielectric layer 202 in the PFET region. As seen in FIG. 5, extended dielectric portion 402 prevents the undercutting of dielectric layer 202, thereby protecting the footing of work function material 104 on the PFET side while etching work function material 104 on NFET side. Although not shown, it should be appreciated that source and drain regions are present along with other material such as inner spacers, all of which function to hold nanosheet layers 112 in place; as such, one of ordinary skill in the art understands that nanosheet layers 112 are not floating in open space.

A wet etch chemistry or dry etch chemistry may be used to remove the remaining work function material 104. As noted above, in one or more embodiments, an example wet etch may be an etchant using RT standard clean 1 (SC1) for 2 minutes, followed by hot $H_2O_2$ for 10 minutes, followed by RT SC1 for 2 minutes. The SC1 clean process uses the APM solution (ammonia hydroxide-hydrogen peroxide water mixture) of the RCA cleaning method. Also, in one or more embodiments, an example wet etch may by RT SC1 for 2 minutes followed by hot SC2 for 5 minutes.

FIG. 6 depicts a cross-sectional view of a portion of the IC 100 after fabrication operations according to one or more embodiments of the invention. FIG. 6 illustrates dielectric layer removal and n-type work function material deposition. Dielectric layer 202 may be selectively removed by any standard etching technique, such as reactive ion etching. Work function material 602 is deposited on the both the NFET and PFET sides. As noted above, work function material 602 is n-type. Example materials for work function material 602 may include titanium nitride, titanium carbide (doped with aluminum), etc. Also, work function material 602 may include a stack having a layer of titanium nitride followed by a layer of titanium carbide (doped with aluminum), which is followed by another layer of titanium nitride, thereby forming an n-type work function material.

FIG. 7A depicts a top view of a simplified illustration of a portion of an IC 700 according to one or more embodiments of the invention. As depicted in FIG. 7A, an X-X view is taken along an axial length of the gate structure. FIGS. 7B-12 depict cross-sectional views of a portion of IC 700 along the X-X view after fabrication operations according to one or more embodiments of the invention. FIGS. 7B-12 illustrate dielectric reflow techniques for N/P boundary control which can apply to FinFET and/or vertical transport FET (VTFET) structures. As understood by one of ordinary skill in the art, VTFETs employ semiconductor fins and side-gates that can be contacted outside the active region, resulting in increased device density and some increased performance over lateral devices. In VTFETs the source to drain current flows in a direction that is perpendicular to a major surface of the substrate. Standard semiconductor fabrication techniques can be utilized to fabricate IC 700 as understood by one of ordinary skill in the art. Moreover, any suitable deposition techniques and etching techniques can be utilized herein.

FIG. 7B depicts a cross-sectional view of a portion of the IC 700 after fabrication operations according to one or more embodiments of the invention. FIG. 7B illustrates the IC 700 after RMG formation has been performed. In FIG. 7B, an NFET side may have a base portion 710 and PFET side may have a base portion 720 in lower-level material 102. As noted herein, lower-level material 102 can be an oxide such as silicon dioxide, etc. Lower-level material 102 can be formed on top of one or more other layers (not shown) such as a substrate. Base portions 710, 720 can be a semiconductor material such as silicon. For VTFETs, one or more portions of base portions 710, 720 can be doped for a desired type of bottom source/drain region, such as a p-type source/drain region for the PFET side and n-type source/drain region for the NFET side.

The NFET side has fins 712 as the channel regions of the transistor, while the PFET side has fins 722 as the channel regions. Fins 712, 722 are semiconductor layers. Example materials of fins 712, 722 may include substantially pure silicon, etc. In one or more embodiments, the widths of fins 712, 722 may be about the same. In one or more embodiments, the widths of fins 712, 722 may vary depending upon the particular application and they need not have the same widths.

During the RMG process, a high-k dielectric material (not shown for conciseness) is formed on fins 712, 722. Subsequently, a work function material 104 is formed on both the NFET side and PFET side of the IC 700 as depicted in FIG. 7B. In FIG. 7B, work function material 104 can be a p-type work function material such as titanium nitride, titanium carbide (doped with aluminum), etc. The thickness of work function material 104 may range from about 1-10 nanometers (nm). Further information regarding high-k dielectric materials and work function materials (metals) has been discussed herein.

FIG. 8 depicts a cross-sectional view of a portion of the IC 700 after fabrication operations according to one or more embodiments of the invention. FIG. 8 illustrates deposition and patterning of a dielectric layer 202 for protecting the PFET side, analogous to FIG. 2 discussed herein. As noted above, dielectric layer 202 could be organic or inorganic; dielectric layer 202 could be deposited by spin on or deposited through physical vapor deposition (PVD), chemical vapor deposition (CVD), atomic layer deposition (ALD), or a combination of such deposition methods. Dielectric layer 202 could be and/or substituted for an organic layer such as an organic planarization layer (OPL), spin on carbon, amorphous carbon, etc. Dielectric layer 202 may be an inorganic layer such as a flowable oxide, SiCOH type low-k materials, spin on metal oxides such as $TiO_x$, $WO_x$, $TaO_x$, $ZrO_x$, etc.), etc. In one or more embodiments, organic layers are excluded. The edge of dielectric layer 202 creates an N/P boundary line 810 between the NFET and PFET sides as depicted by the dashed boundary line 810. Low temperature baking of dielectric layer 202 is performed. An example range of temperatures for low temperature baking of dielectric layer 202 may include 100-250° C.

FIG. 9 depicts a cross-sectional view of a portion of the IC 700 after fabrication operations according to one or more embodiments of the invention. FIG. 9 illustrates removal of exposed portions of work function material 104. The etching of work function material 104 undercuts dielectric layer 202, thereby etching and exposing a lower portion of work function material 104 in gap/opening 902. A wet etch chemistry or dry etch chemistry may be used. As previously noted, in one or more embodiments, an example wet etch may be an etchant using RT SC1 for 2 minutes, followed by hot $H_2O_2$ for 10 minutes, followed by RT SC1 for 2 minutes. In one or more embodiments, an example wet etch may by RT SC1 for 2 minutes followed by hot SC2 for 5 minutes.

FIG. 10 depicts a cross-sectional view of a portion of the IC 700 after fabrication operations according to one or more embodiments of the invention. FIG. 10 depicts dielectric layer reflow. In order to reflow dielectric layer 202, dielectric layer 202 can be heated to a temperature ranging from about 100-600° Celsius (C). As previously noted, in one or more embodiments, reflowing dielectric layer 202 includes heating dielectric layer 202 to a temperature to decrease viscosity of dielectric layer 202, which then enables the film of dielectric material to flow in a controlled manner. In one or more embodiments, reflowing dielectric layer 202 included exposing the dielectric material of dielectric layer 202 to UV radiation (and thermal energy, i.e., increased temperatures) to decrease viscosity of dielectric layer 202, which then enable the film of dielectric material to flow in a controlled manner. In one or more embodiments, the reflow of dielectric layer 202 can be controlled by the crosslinking agents in the dielectric material of dielectric layer 202, in the case of spin on metal oxides and low-k silicon films. In one or more embodiments, the reflow of dielectric layer 202 can be controlled by the temperature, gas flow, and pressure applied to the dielectric layer 202, such as in the case of flowable oxide. For example, a temperature of about 300° C. with a pressure of about 1 atmosphere in inert atmosphere be utilized to reflow dielectric layer 202.

Reflow of dielectric layer 202 results in an extended dielectric portion 1002 of dielectric layer 202, where extended dielectric portion 1002 has a new N/P boundary line 1010. As can be seen in FIG. 10, boundary line 1010 of extended dielectric portion 502 is closer to the NFET side than and extends beyond boundary line 810. For example, extended dielectric portion 402 can be a distance of "X" closer to the NFET side than the previous boundary line 210 of dielectric layer 202, thereby providing additional protection against undercutting dielectric layer 202 in subsequent etching of work function material 104 that is between fins 712.

FIG. 11 depicts a cross-sectional view of a portion of the IC 700 after fabrication operations according to one or more embodiments of the invention. FIG. 11 illustrates full removal of work function material 104 in the NFET region while work function material 104 is protected by reflowed dielectric layer 202 in the PFET region. As seen in FIG. 11, extended dielectric portion 1002 prevents the undercutting of dielectric layer 202, thereby protecting the footing of work function material 104 on the PFET side while etching work function material 104 on NFET side. A wet etch chemistry or dry etch chemistry may be used to remove the remaining work function material 104. As noted above, in one or more embodiments, an example wet etch may be an etchant using RT SC1 for 2 minutes, followed by hot $H_2O_2$ for 10 minutes, followed by RT SC1 for 2 minutes. Also, in one or more embodiments, an example wet etch may by RT SC1 for 2 minutes followed by hot SC2 for 5 minutes.

FIG. 12 depicts a cross-sectional view of a portion of the IC 100 after fabrication operations according to one or more embodiments of the invention. FIG. 12 illustrates dielectric layer removal and n-type work function material deposition. Work function material 602 is deposited on the both the NFET and PFET sides. As noted above, work function material 602 is n-type. Example work function materials 602 discussed herein may be utilized for forming an n-type work function material. For VTFETs, a top source/drain region (not shown) is formed on top portions of fins 712, 722. For FinFETs, source/drain regions (not shown) are formed in the fins 712, 722 such that one source/drain is on opposite sides of the gate material.

Figure 13A:
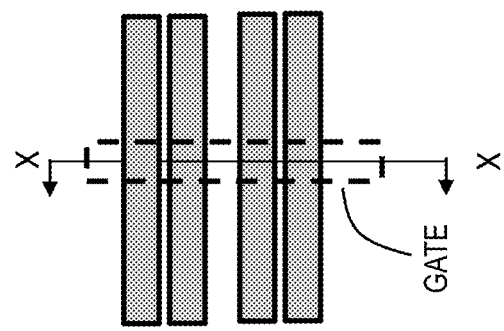
FIG. 13A depicts a top view of a simplified illustration of a portion of an IC which is implemented using dielectric reflow techniques for boundary control according to one or more embodiments of the invention.

FIG. 13A depicts a top view of a simplified illustration of a portion of an IC 1300 according to one or more embodiments of the invention. As depicted in FIG. 13A, an X-X view is taken along an axial length of the gate structure. FIGS. 13B-21 depict cross-sectional views of a portion of an IC 1300 after fabrication operations according to one or more embodiments of the invention. Using reflow techniques for boundary control, FIGS. 13B-21 can apply to nanosheet and/or nanowire structures and are analogous to the description discussed for nanosheets/nanowires in FIGS. 13B-6, with the exception that FIGS. 13B-21 further describe multi-type OPL/dielectric layer boundary control. Standard semiconductor fabrication techniques can be utilized to fabricate IC 1300 as understood by one of ordinary skill in the art. Moreover, any suitable deposition techniques and etching techniques can be utilized herein.

Figure 13B:
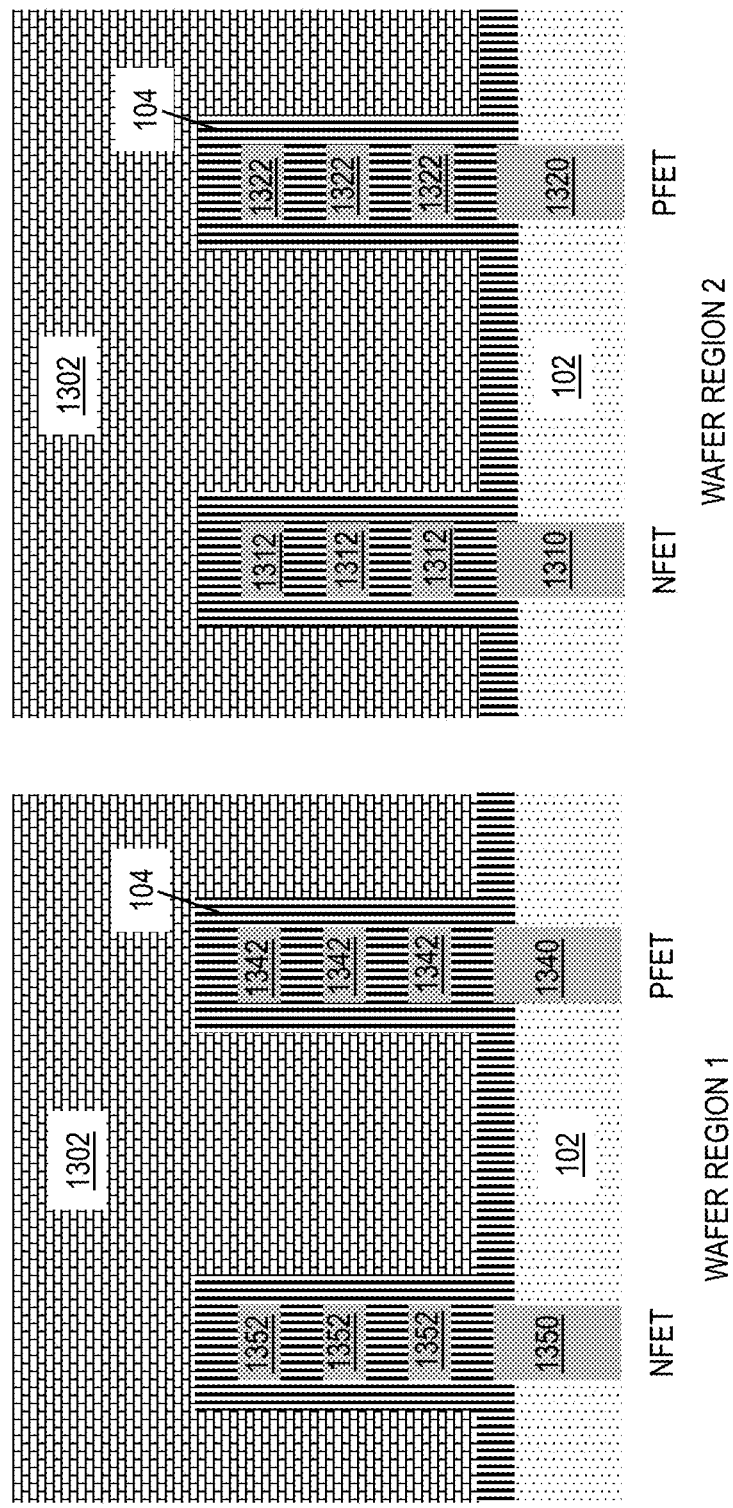
FIG. 13B depicts a cross-sectional view of a portion of an IC under-fabrication after fabrication operations according to one or more embodiments of the invention.

FIG. 13B depicts a cross-sectional view of a portion of the IC 1300 after fabrication operations according to one or more embodiments of the invention. FIG. 13B illustrates the IC 1300 after RMG formation has been performed. FIG. 13B illustrates wafer region 1 having both NFET and PFET sides along with wafer region 2 having both NFET and PFET sides. Wafer regions 1 and 2 are on the same wafer, such that fabrication operations can be performed concurrently. In FIG. 13B, the NFET side of wafer region 1 may have a base portion 1350 and PFET side may have a base portion 1340 in lower-level material 102. Similarly, NFET side of wafer region 2 may have a base portion 1310 and PFET side may have a base portion 1320 in lower-level material 102. Lower-level material 102 can be formed on top of one or more other layers (not shown) such as a substrate. Base portions 1310, 1320, 1340, 1350 can be a semiconductor material such as silicon. In one or more embodiments, base portions 1310, 1320, 1340, 1350 may not be present.

The NFET side of wafer region 1 has nanosheet layers 1352 as the channel regions of the transistor, while the PFET side has nanosheet layers 1342 as the channel regions. The NFET side of wafer region 2 has nanosheet layers 1312 as the channel regions of the transistor, while the PFET side has nanosheet layers 1322 as the channel regions. Nanosheets layers 1312, 1322, 1342, 1352 are semiconductor layers, and example materials may include substantially pure silicon, etc. In one or more embodiments, the thicknesses of nanosheet layers 1312, 1322, 1342, 1352 may be about the same, and/or may vary depending upon the particular application, as they need not have the same thicknesses.

During the RMG process, a high-k dielectric material (not shown for conciseness) is formed to wrap around nanosheet layers 1312, 1322, 1342, 1352. Subsequently, a work function material 104 is formed on both the wafer region 1 and wafer region 2 of the IC 100 as depicted in FIG. 13B. In FIG. 13B, work function material 104 can be a p-type work function material as previously discussed herein.

Figure 14:
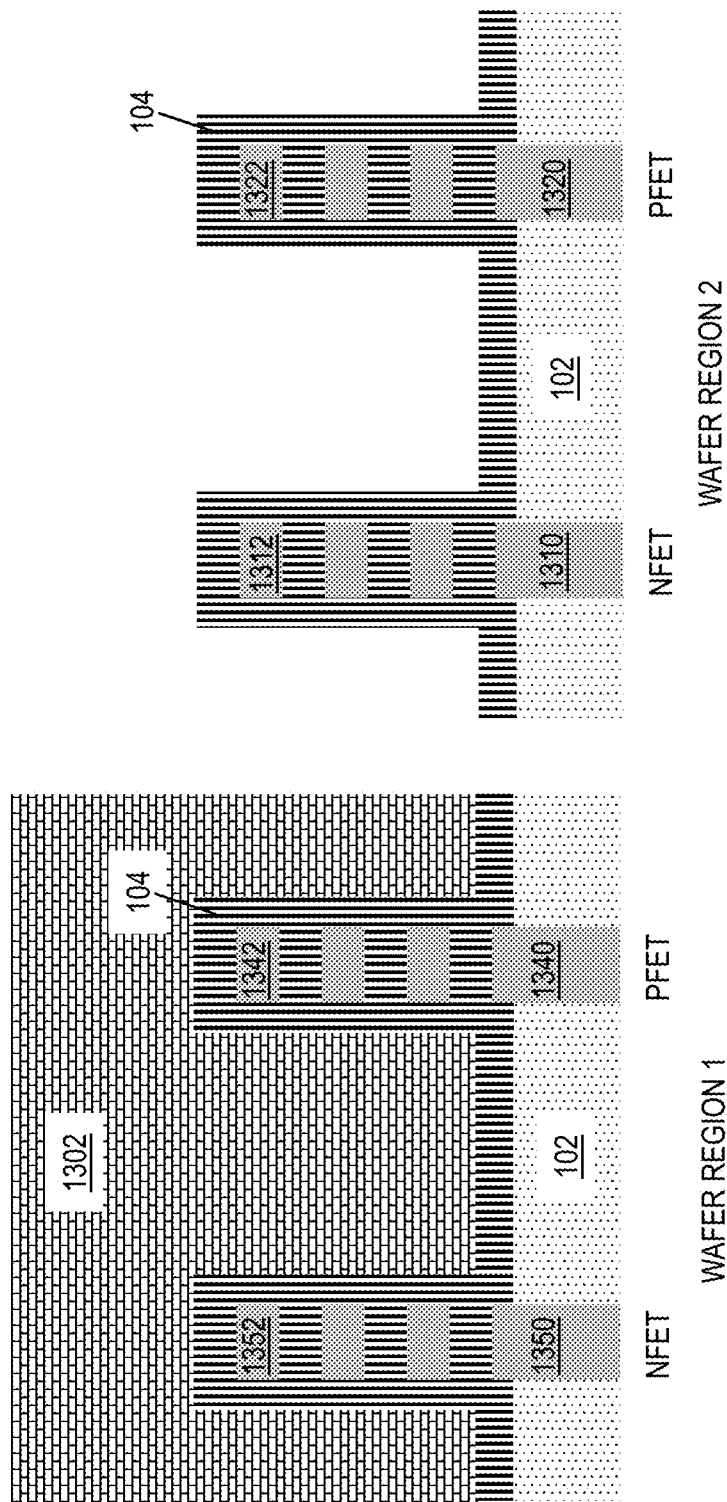
FIG. 14 depicts a cross-sectional view of a portion of an IC under-fabrication after fabrication operations according to one or more embodiments of the invention.
Figure 15:
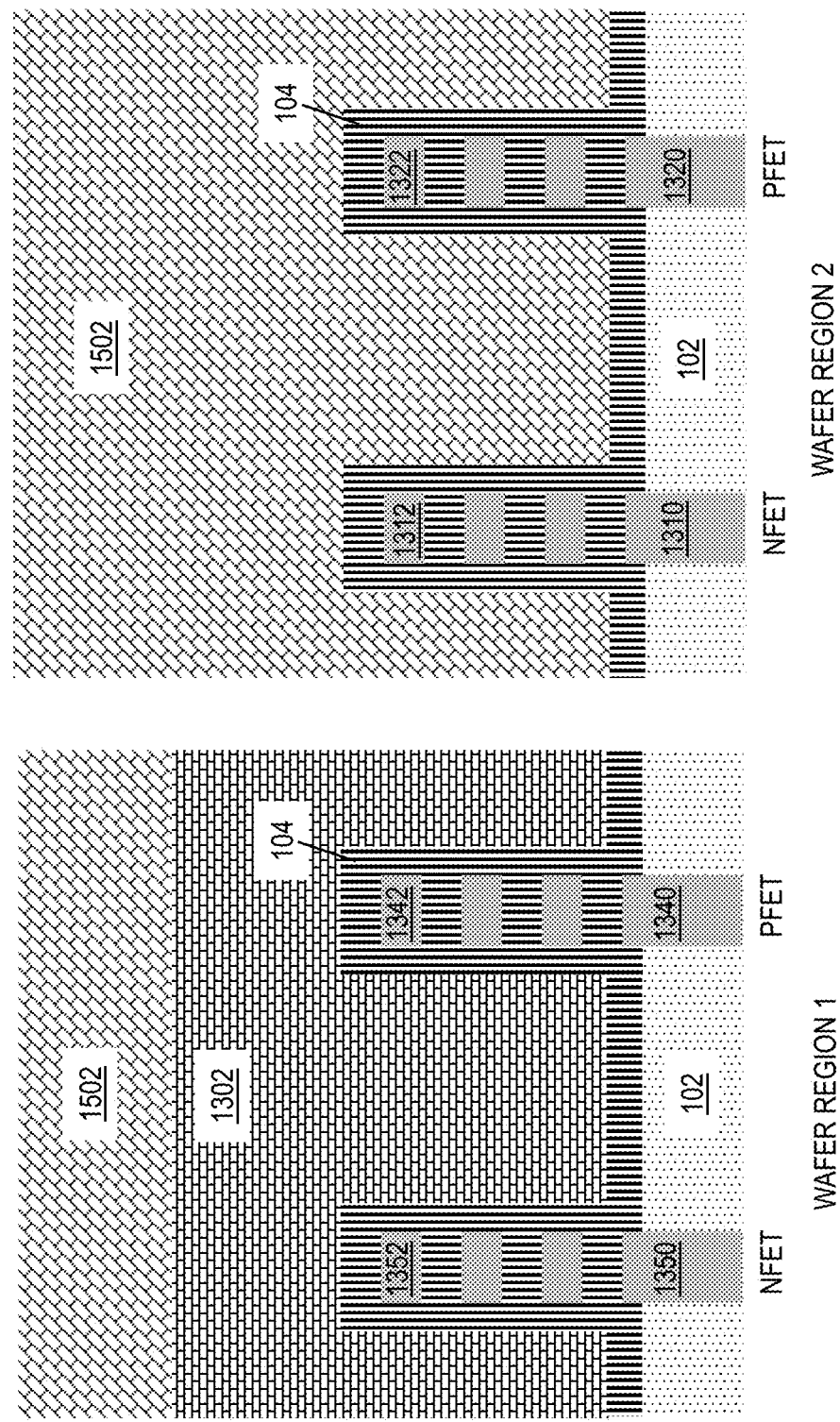
FIG. 15 depicts a cross-sectional view of a portion of an IC under-fabrication after fabrication operations according to one or more embodiments of the invention.

FIG. 13B illustrates deposition of a block layer 1302 over both wafer regions 1, 2 including their respective NFET and PFET sides. Block layer 1302 can be a first dielectric layer or a first organic planarization layer (OPL). It is noted that block layer 1302 is a different material from block layer 1502 which can be a second dielectric layer or a second OPL as depicted in FIG. 15. FIG. 14 depicts a cross-sectional view of a portion of the IC 1300 after fabrication operations according to one or more embodiments of the invention. FIG. 14 illustrates removal of block layer 1302 in wafer region 2. A mask can be used to protect wafer region 1 while wafer region 2 is etched.

FIG. 15 depicts a cross-sectional view of a portion of the IC 1300 after fabrication operations according to one or more embodiments of the invention. FIG. 15 illustrates deposition of block layer 1502 on top of block layer 1302 in wafer region 1 and on top of work function material 104 in wafer region 2. Block layer 1502 is a different material from block layer 1302. The block layers 1302, 1502 are intended to be materials that have different reflow rates in order to be used with different pitches between an NFET and PFET side in one wafer region versus an NFET and PFET side in another wafer region. Block layer 1502 can be a second dielectric layer or a second OPL, where the second dielectric layer or second OPL are different from the first dielectric layer or first OPL respectively in block layer 1302. Although different materials are utilized for block layers 1302, 1502, example materials discussed for dielectric layer 202 may be utilized.

In order for the first dielectric material of block layer 1302 to have a faster reflow rate and/or lower viscosity as compared to the second dielectric material of block layer 1502 during reflow, example materials of the first dielectric layer can include silicon dioxide, titanium dioxide, hafnium oxide, etc., while example materials of the second dielectric material of block layer 1502 can include silicon oxycarbide (SiOC), silicon boron oxycarbide (SiBOC), silicon nitride (SiN), etc. In order for the first OPL of block layer 1302 to have a faster reflow rate and/or lower viscosity as compared to the second OPL of block layer 1502 during reflow, example materials of the first OPL can include a straight chain polymer organic material, while example materials of the second OPL of block layer 1502 can include an organic material with aromatic chains that has a different rate of reflow under the same temperature/pressure conditions. It is noted that the material of block layers 1302, 1502 can be switched to achieve one wafer region with a faster reflow rate as compared to the other wafer region with a slower reflow rate, all of which are under the same (concurrent) reflow conditions.

Figure 16:
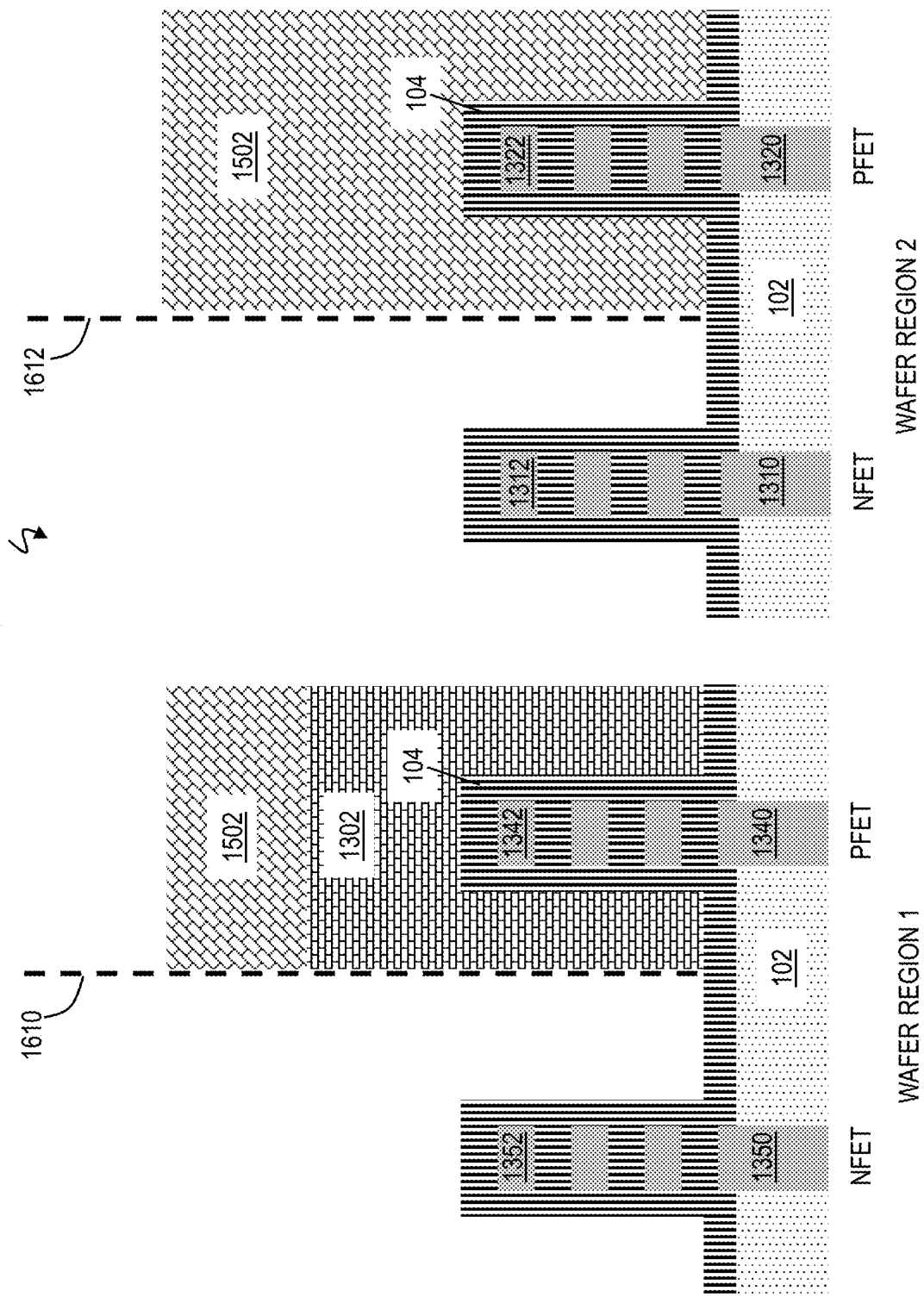
FIG. 16 depicts a cross-sectional view of a portion of an IC under-fabrication after fabrication operations according to one or more embodiments of the invention.

FIG. 16 depicts a cross-sectional view of a portion of the IC 1300 after fabrication operations according to one or more embodiments of the invention. FIG. 16 illustrates patterning block layers 1302, 1502 to cover and protect the PFET sides. For example, the stack of block layers 1302, 1502 protects the PFET side in wafer region 1 while being removed from the NFET side. Similarly, block layer 1502 protects the PFET side in wafer region 2, while its NFET side is exposed. FIG. 16 illustrates N/P boundary line 1610 on wafer region 1 and N/P boundary line 1612 on wafer region 2.

Figure 17:
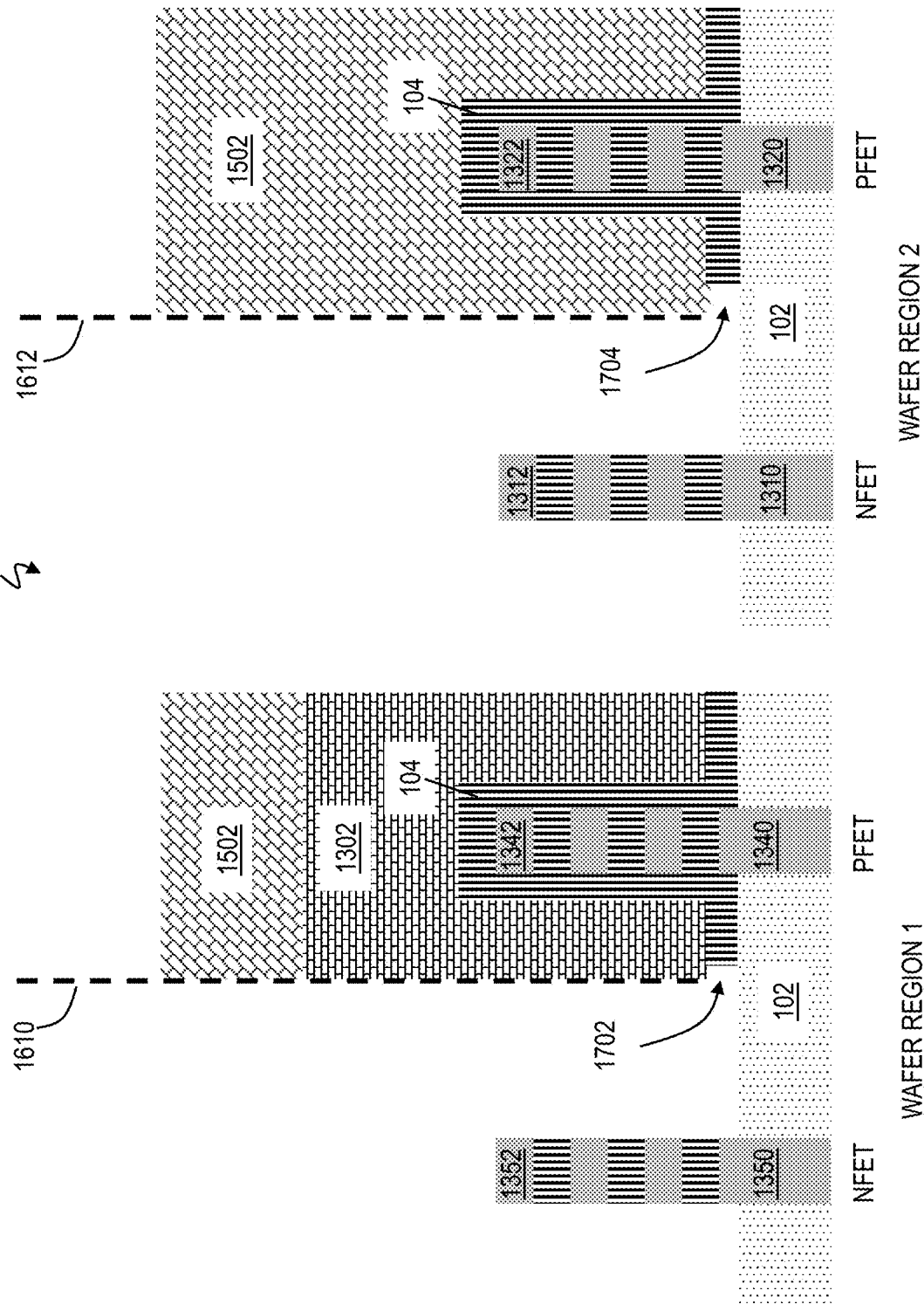
FIG. 17 depicts a cross-sectional view of a portion of an IC under-fabrication after fabrication operations according to one or more embodiments of the invention.

FIG. 17 depicts a cross-sectional view of a portion of the IC 1300 after fabrication operations according to one or more embodiments of the invention. FIG. 17 illustrates removal of exposed portions of work function material 104. The etching of work function material 104 undercuts block layer 1302 in wafer region 1 and block layer 1502 in wafer region 2, thereby etching and exposing a lower portion of work function material 104 in gap/opening 1702 and gap/opening 1704, respectively. A wet etch chemistry or dry etch chemistry may be used, as previously noted herein.

Figure 18:
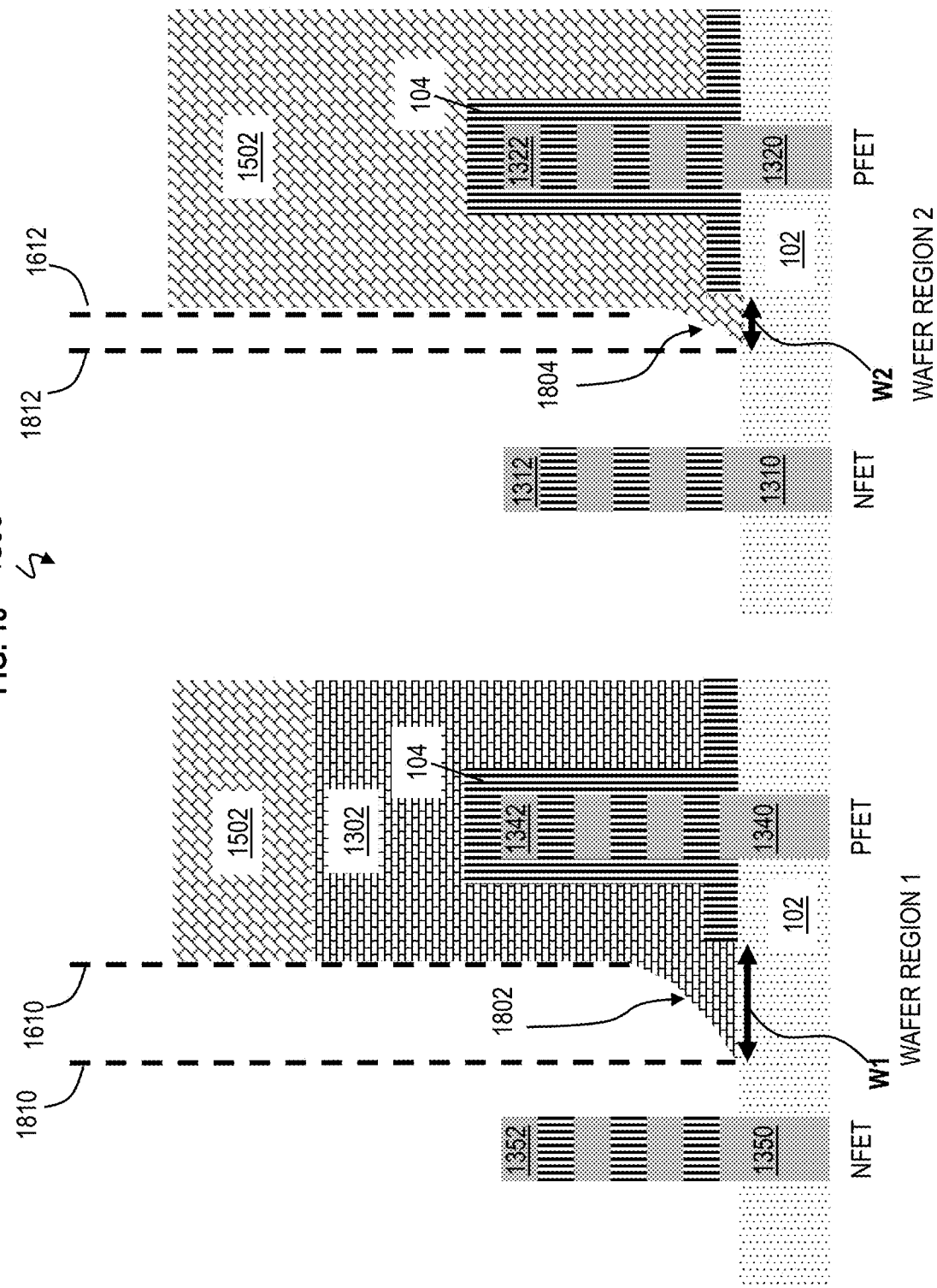
FIG. 18 depicts a cross-sectional view of a portion of an IC under-fabrication after fabrication operations according to one or more embodiments of the invention.

FIG. 18 depicts a cross-sectional view of a portion of the IC 1300 after fabrication operations according to one or more embodiments of the invention. FIG. 18 depicts dielectric layer reflow or OPL reflow. In order to reflow block layers 1302, 1502 (e.g., two dielectric layers or two different OPLs), block layers 1302, 1502 can be heated to a temperature ranging from about 100-600° C. In one or more embodiments, reflowing block layers 1302, 1502 includes heating block layers 1302, 1502 to a temperature to decrease viscosity of block layers 1302, 1502, which then enables the films of block layers 1302, 1502 to flow in a controlled manner. In one or more embodiments, reflowing block layers 1302, 1502 includes exposing the materials of block layers 1302, 1502 to UV radiation (and thermal energy, i.e., increased temperatures) to decrease viscosity of block layers 1302, 1502, which then enable the films of block layers 1302, 1502 to flow in a controlled manner. In one or more embodiments, the reflow of block layers 1302, 1502 can be controlled by the crosslinking agents in the material of block layers 1302, 1502, in the case of spin on metal oxides and low-k silicon films. In one or more embodiments, the reflow of block layers 1302, 1502 can be controlled by the temperature, gas flow, and pressure applied to the dielectric layer 202, such as in the case of flowable oxide. For example, reflow of block layers 1302, 1502 can any temperatures and/or pressure discussed herein for reflow.

Reflow of block layer 1302 in wafer region 1 results in an extended block portion 1802 of block layer 1302, where extended block portion 1802 is closer to the NFET side than the original edge of block layer 1302 at boundary line 1610 prior to reflow. Extended block portion 1802 has new boundary line 1810. Reflow of block layer 1502 in wafer region 2 results in an extended block portion 1804 of block layer 1502, where extended block portion 1804 is closer to the NFET side than the original edge of block layer 1502 at boundary line 1612 prior to reflow. Extended block portion 1802 has new boundary line 1810.

In the example scenario, NFET and PFET in wafer region 2 have a tighter fin pitch (i.e., smaller distance between fins), than the fin pitch of NFET and PFET in wafer region 1. Accordingly, the width/distance W1 of extended block portion 1802 is greater than the width/distance W2 of extended block portion 1804. In other words, the concurrent reflow operations can meet requirement of various fin pitches on the same wafer by using the block stack of block layers 1302, 1502 in wafer region 1 and block layer 1502 in wafer region 2.

Figure 19:
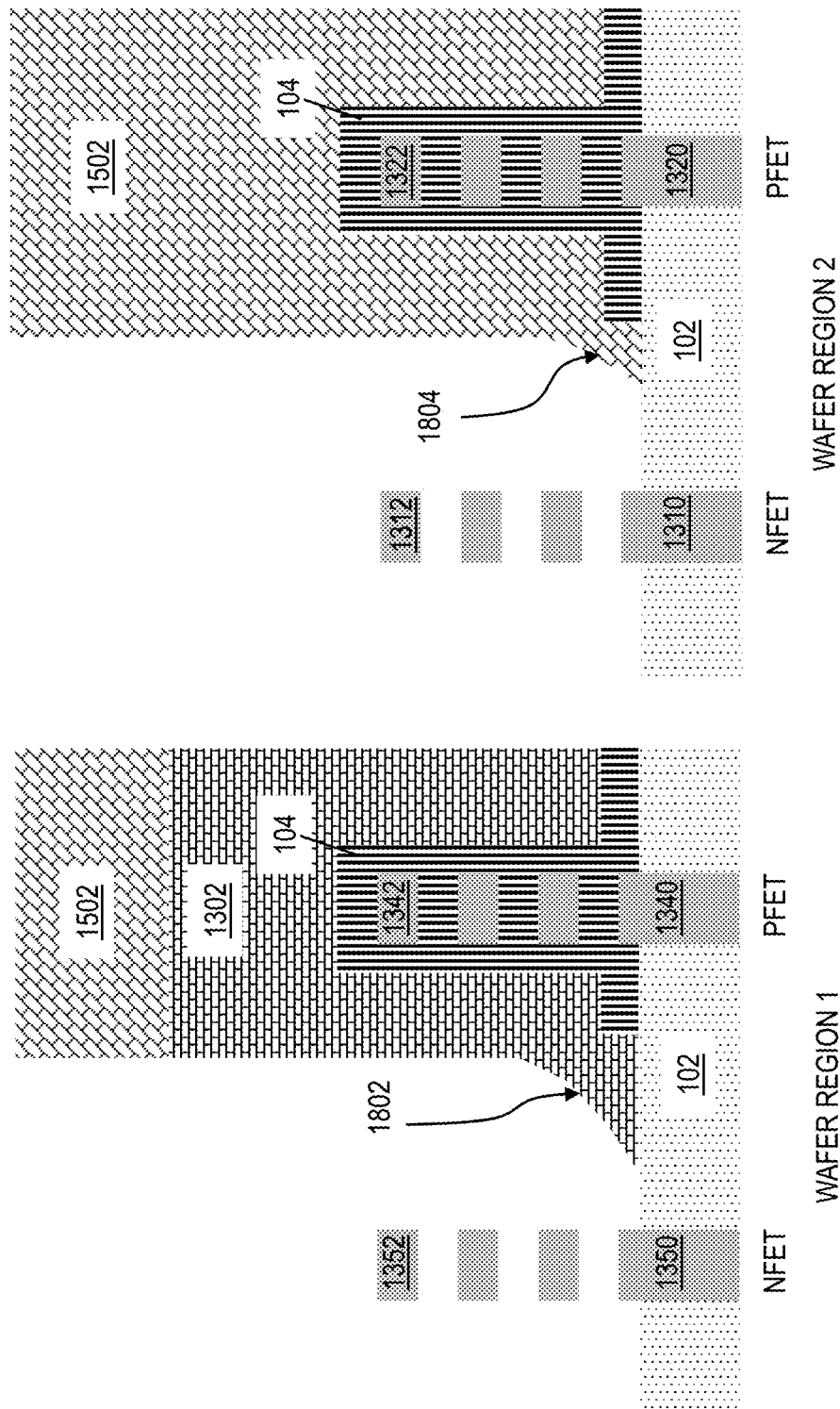
FIG. 19 depicts a cross-sectional view of a portion of an IC under-fabrication after fabrication operations according to one or more embodiments of the invention.

FIG. 19 depicts a cross-sectional view of a portion of the IC 1300 after fabrication operations according to one or more embodiments of the invention. FIG. 19 illustrates full removal of work function material 104 in the NFET regions in wafer regions 1, 2 while work function material 104 is protected by reflowed block layers 1302, 1502 in the PFET regions in wafer regions 1, 2, respectively. As seen in FIG. 19, extended block portions 1802, 1804 prevents the undercutting of block layers 1302, 1502, thereby protecting the footing of work function material 104 on the PFET sides while etching work function material 104 on NFET sides. Although not shown, it should be appreciated that source and drain regions are present along with other material such as inner spacers, all of which function to hold nanosheet layers 1312, 1352 in place; as such, one of ordinary skill in the art understands that nanosheet layers 1312, 1352 are not floating in open space. As noted herein, a wet etch chemistry or dry etch chemistry may be used to remove the remaining work function material 104.

Figure 20:
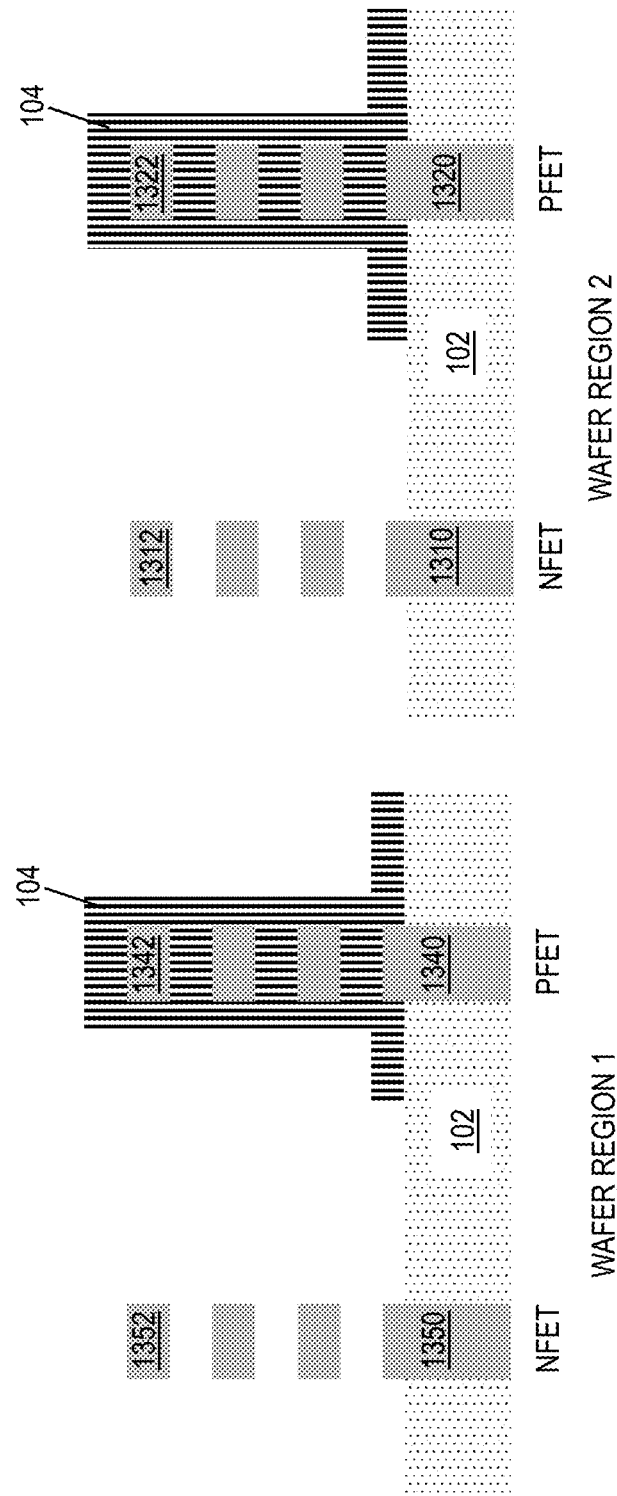
FIG. 20 depicts a cross-sectional view of a portion of an IC under-fabrication after fabrication operations according to one or more embodiments of the invention.

FIG. 20 depicts a cross-sectional view of a portion of the IC 1300 after fabrication operations according to one or more embodiments of the invention. FIG. 20 illustrates block layers 1302, 1502 removal. Standard etching techniques may be utilized to remove block layers 1302, 1502, including a reactive ion etch. It is noted that the material of lower-level material 102 is different from the materials of block layers 1302, 1502 such that the block layers can be selectively etched.

Figure 21:
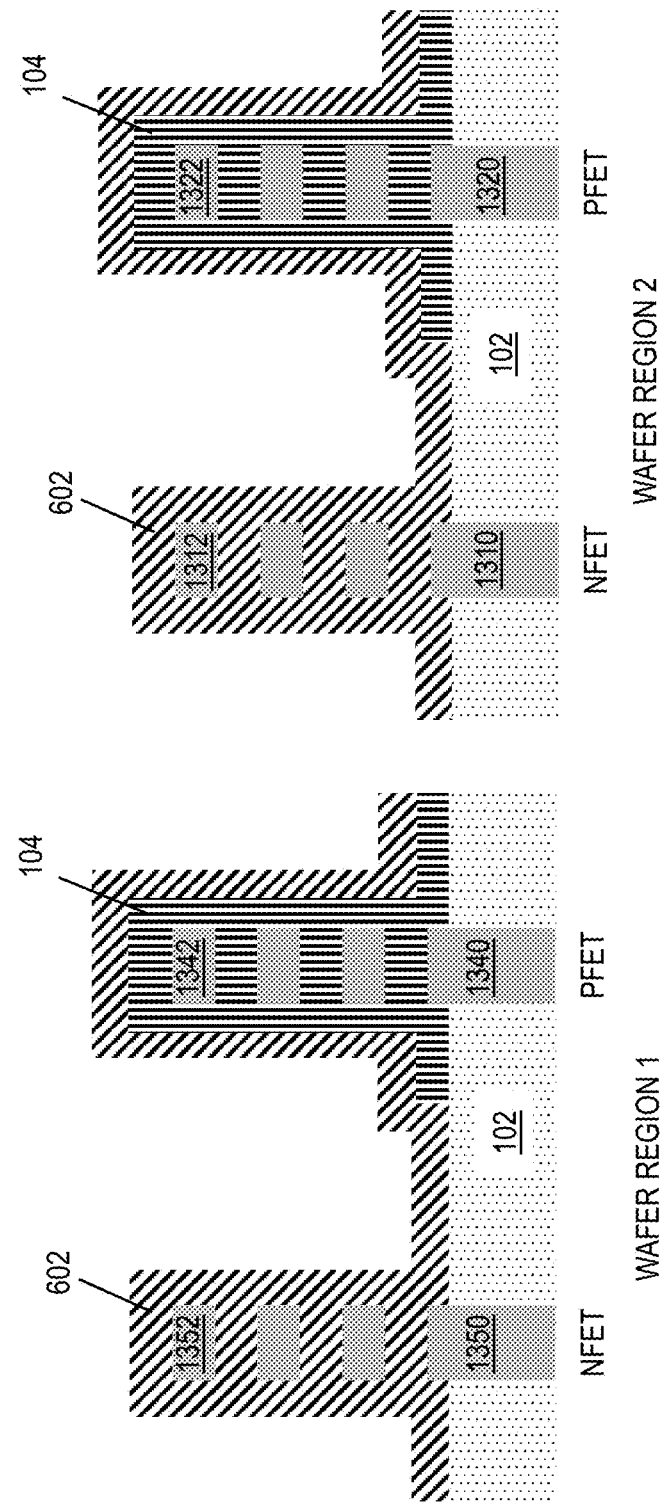
FIG. 21 depicts a cross-sectional view of a portion of an IC under-fabrication after fabrication operations according to one or more embodiments of the invention.

FIG. 21 depicts a cross-sectional view of a portion of the IC 1300 after fabrication operations according to one or more embodiments of the invention. FIG. 21 illustrates n-type work function material deposition. Work function material 602 is deposited on the both the NFET and PFET sides. As noted above, work function material 602 is n-type. Work function material 602 could be titanium nitride, titanium carbide (doped with aluminum), etc. For example, work function material 602 may include a stack having a layer of titanium nitride followed by a layer of titanium carbide (doped with aluminum), which is followed by another layer of titanium nitride, thereby forming an n-type work function material.

Accordingly, IC 1300 includes an NFET and PFET adjacent to one another with a wide fin pitch on wafer region 1 and an NFET and PFET adjacent to one another with a smaller fin pitch on wafer region 2, in which both fin pitches were accommodated using block layers 1302, 1502 as discussed herein. One or more embodiments can provide different widths (e.g., W1, W2 where width W1 is greater than W2 depicted in FIG. 18) during reflow of block layer 1302, 1502.

FIGS. 22-30 depict cross-sectional views of a portion of an integrated circuit (IC) 2200 after fabrication operations according to one or more embodiments of the invention. FIGS. 22-30 can apply to any OPL/dielectric reflow patterning for protection of the underlying material and can be utilized with formation of lines, such as conductive/metal lines. Standard semiconductor fabrication techniques can be utilized to fabricate IC 2200 as understood by one of ordinary skill in the art. Moreover, any suitable deposition techniques and etching techniques can be utilized herein.

Figure 22:
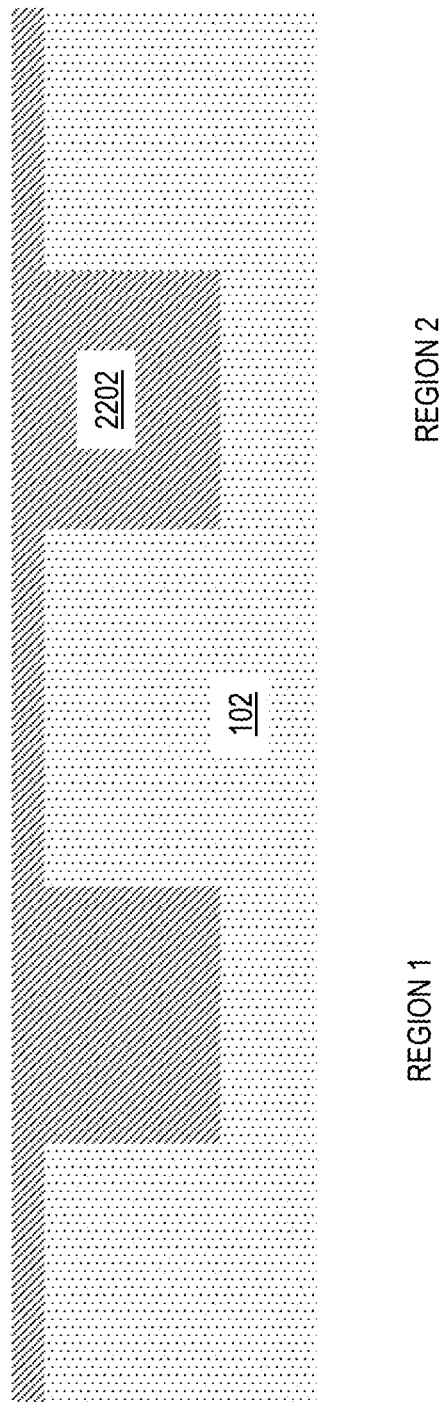
FIG. 22 depicts a cross-sectional view of a portion of an IC under-fabrication which is implemented using dielectric reflow techniques for boundary control according to one or more embodiments of the invention.
Figure 29:
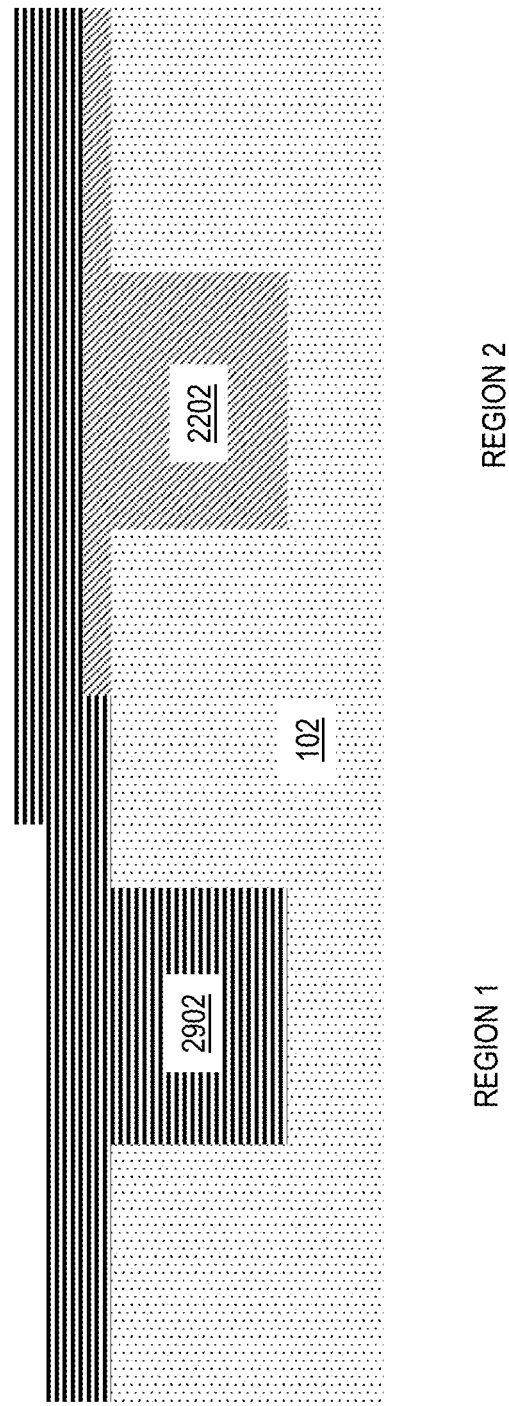
FIG. 29 depicts a cross-sectional view of a portion of an IC under-fabrication after fabrication operations according to one or more embodiments of the invention.

FIG. 22 depicts a cross-sectional view of a portion of the IC 2200 after fabrication operations according to one or more embodiments of the invention. FIG. 22 illustrates the IC 2200 after cavities have been formed in lower-level material 102 of regions 1 and 2, and the cavities are filled with a first material layer 2202. First material layer 2202 is a material that can be selectively etched with respect to block 1302 depicted in FIG. 23. First material layer 2202 can be a metal, a metallic material, and/or any conductive material utilized in integrated circuits. First material layer 2202 may include titanium nitride. Other example materials of first material layer 2202 may include a metal such as titanium nitride and/or any material that can be etched selective to the material of block 1302. A second material layer 2902 may include a metal and/or any material that can be etched selective to the material of block 1302 as depicted in FIG. 29. First material layer 2202 is a different material than second material layer 2902. Regions 1 and 2 are on the same wafer, such that fabrication operations can be performed concurrently. Lower-level material 102 can be formed on top of one or more other layers (not shown) such as a substrate.

Figure 23:
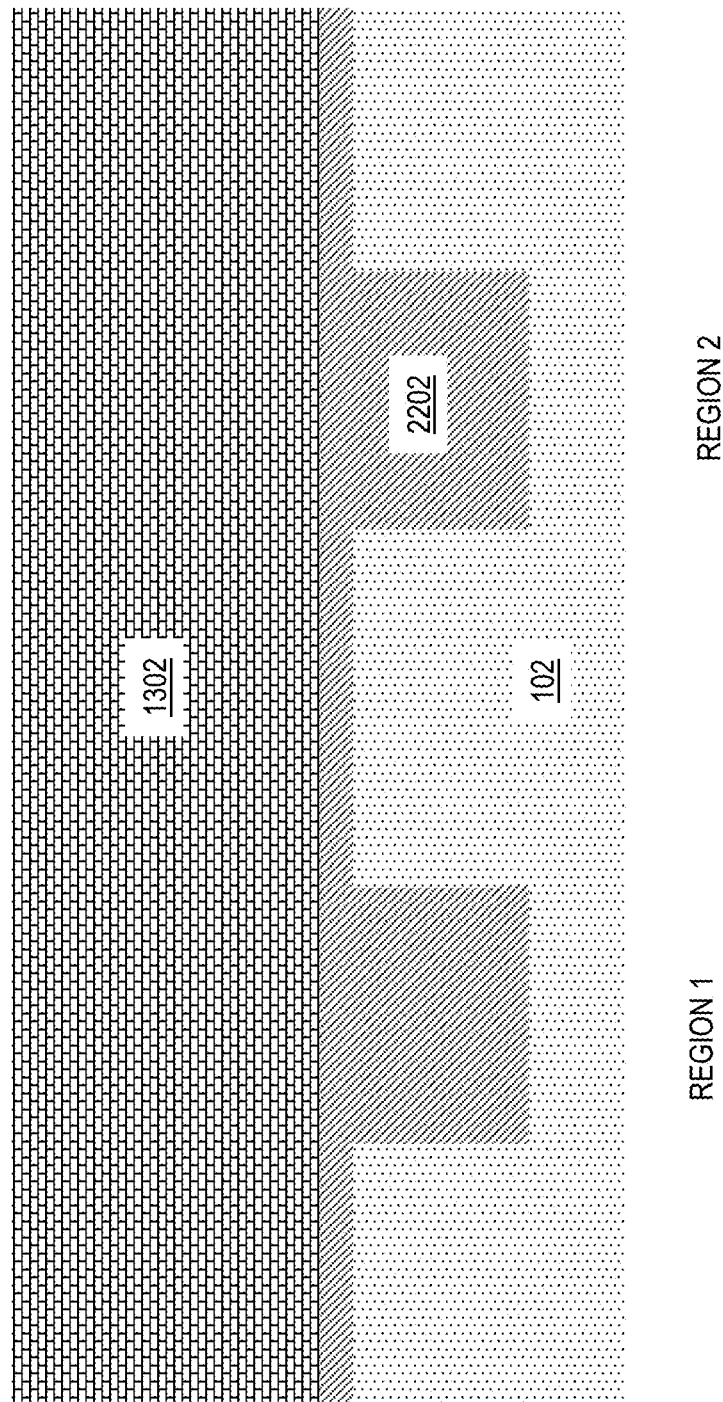
FIG. 23 depicts a cross-sectional view of a portion of an IC under-fabrication after fabrication operations according to one or more embodiments of the invention.

FIG. 23 depicts a cross-sectional view of a portion of the IC 2200 after fabrication operations according to one or more embodiments of the invention. FIG. 23 illustrates conformal deposition of block layer 1302 over both regions 1, 2. Block layer 1302 can be a dielectric layer, OPL, and/or any other kind of material discussed herein. It one or more embodiments, block layer 1302 can exclude organic materials.

Figure 24:
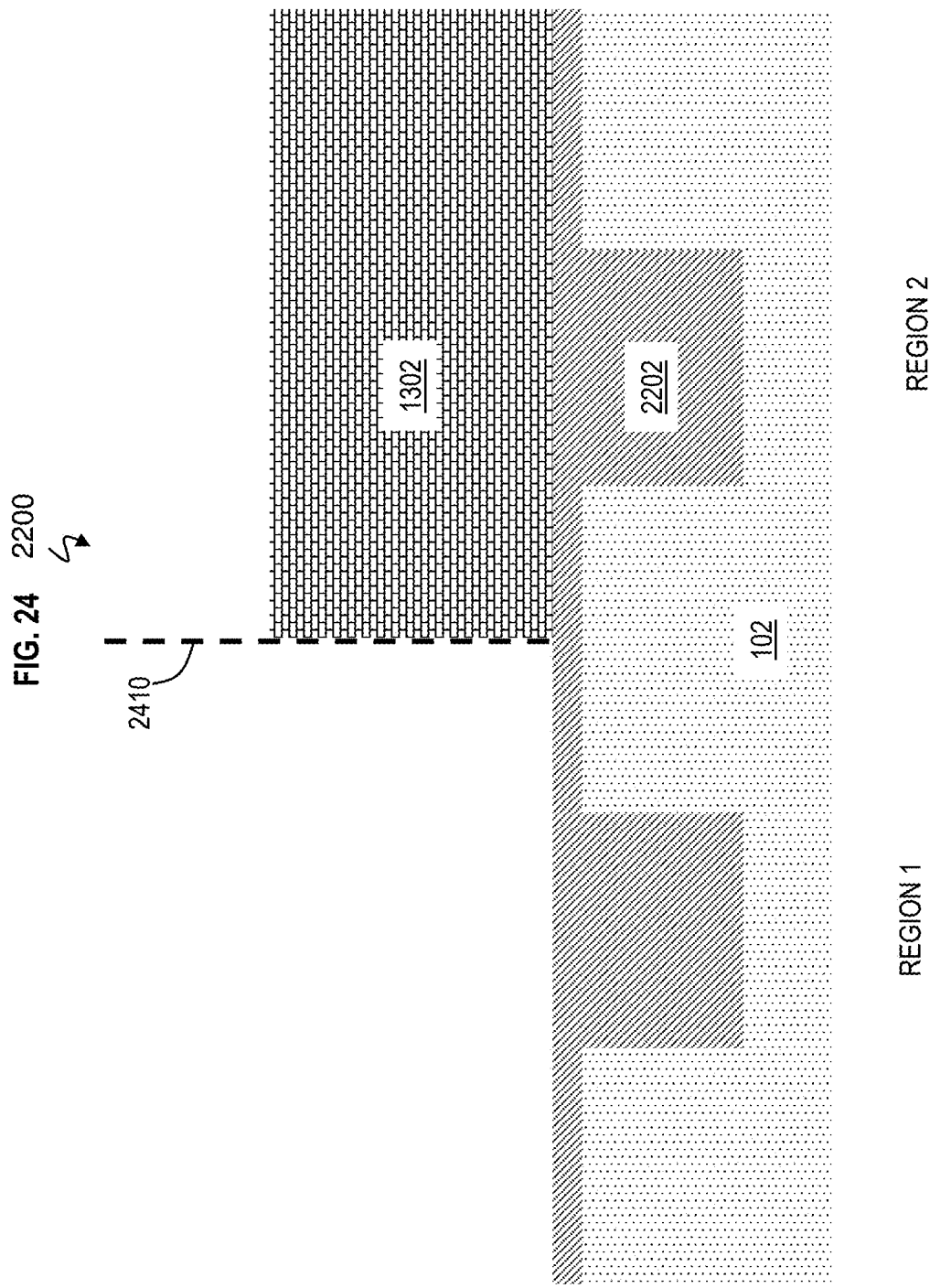
FIG. 24 depicts a cross-sectional view of a portion of an IC under-fabrication after fabrication operations according to one or more embodiments of the invention.
Figure 25:
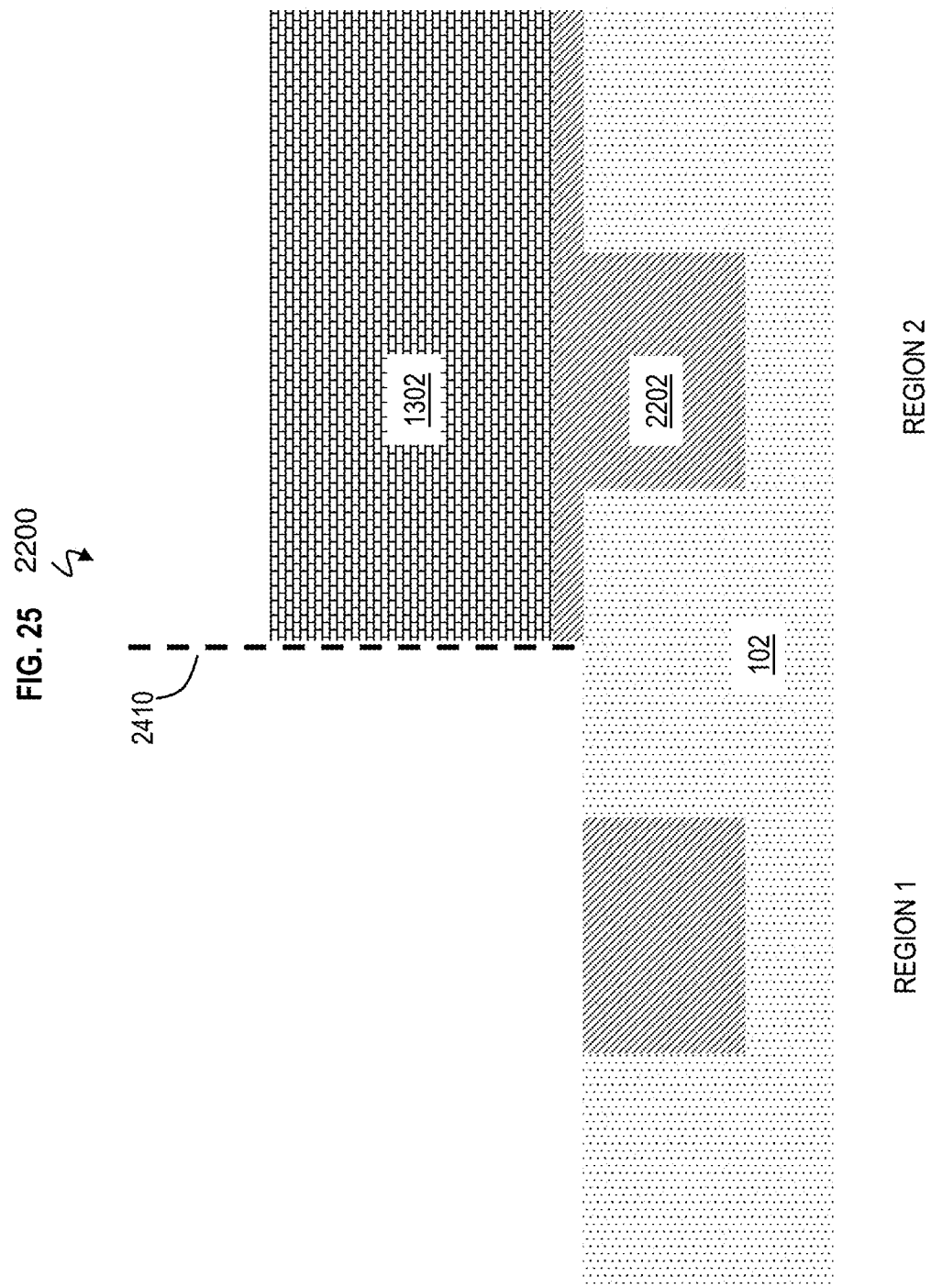
FIG. 25 depicts a cross-sectional view of a portion of an IC under-fabrication after fabrication operations according to one or more embodiments of the invention.
Figure 26:
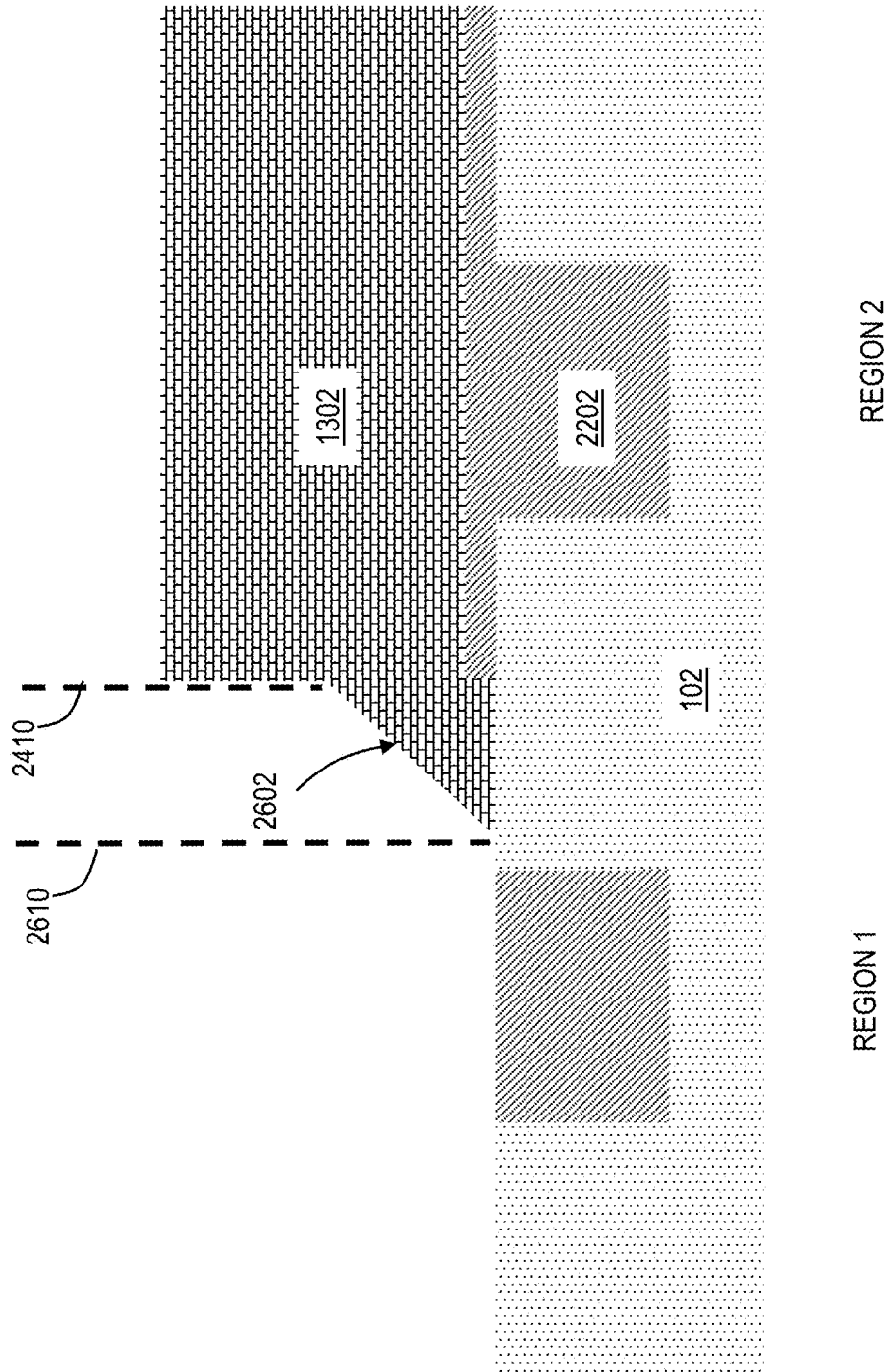
FIG. 26 depicts a cross-sectional view of a portion of an IC under-fabrication after fabrication operations according to one or more embodiments of the invention.

FIG. 24 depicts a cross-sectional view of a portion of the IC 2200 after fabrication operations according to one or more embodiments of the invention. FIG. 24 illustrates selectively etching block layer 1302 in region 1, for example, using a reactive ion etch, while region 2 remains protected. FIG. 24 shows boundary line 2410. FIG. 25 depicts a cross-sectional view of a portion of the IC 2200 after fabrication operations according to one or more embodiments of the invention. FIG. 25 illustrates etching a portion of first material layer 2202 in region 1, while region 2 remains protected. FIG. 26 depicts a cross-sectional view of a portion of the IC 2200 after fabrication operations according to one or more embodiments of the invention. FIG. 26 illustrates block layer reflow at region 2 using any techniques discussed herein. As discussed herein, a portion of block layer 1302 in region 1 extends toward region 2, thereby further protecting first material layer 2202 in region 2 in preparation for subsequent etching. FIG. 26 shows a new boundary line 2610.

Figure 27:
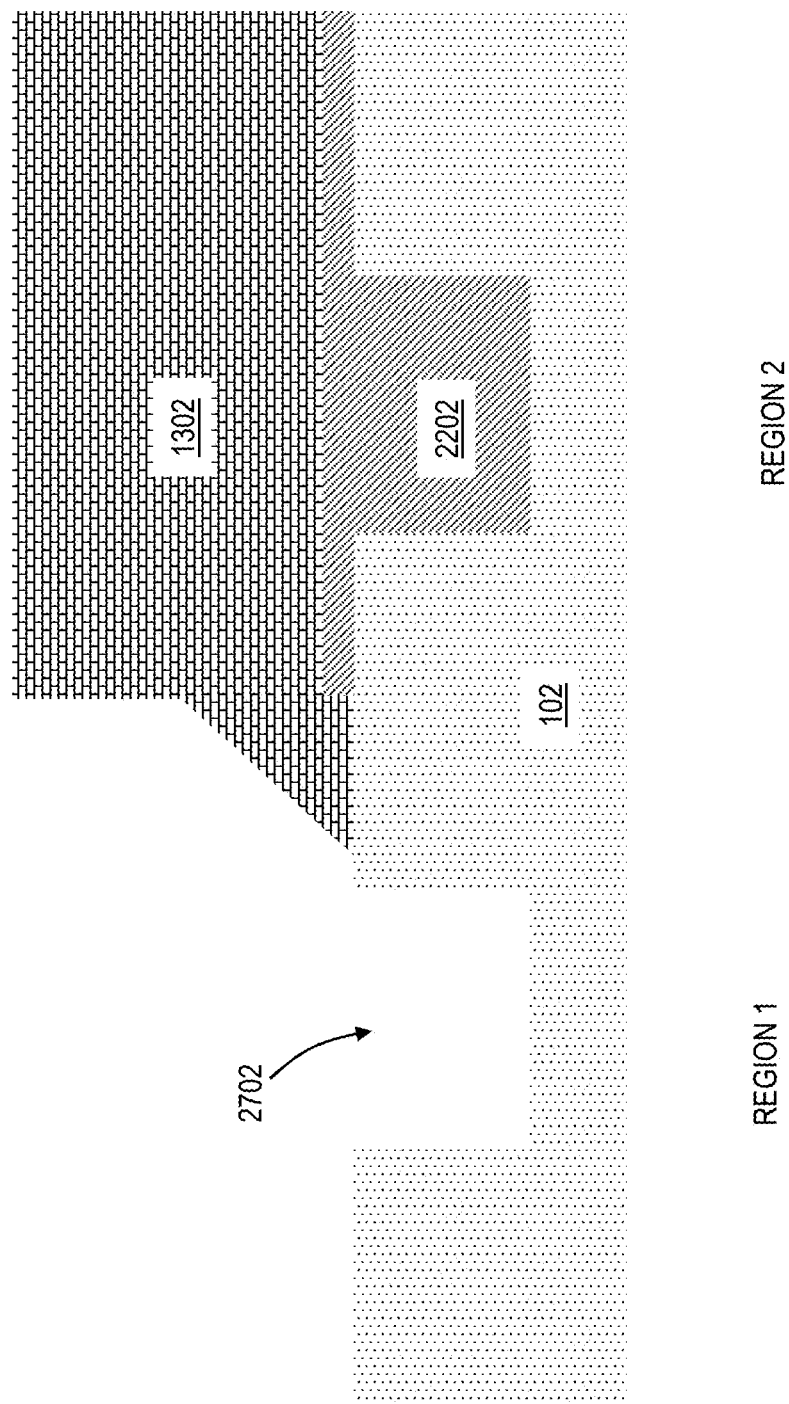
FIG. 27 depicts a cross-sectional view of a portion of an IC under-fabrication after fabrication operations according to one or more embodiments of the invention.
Figure 28:
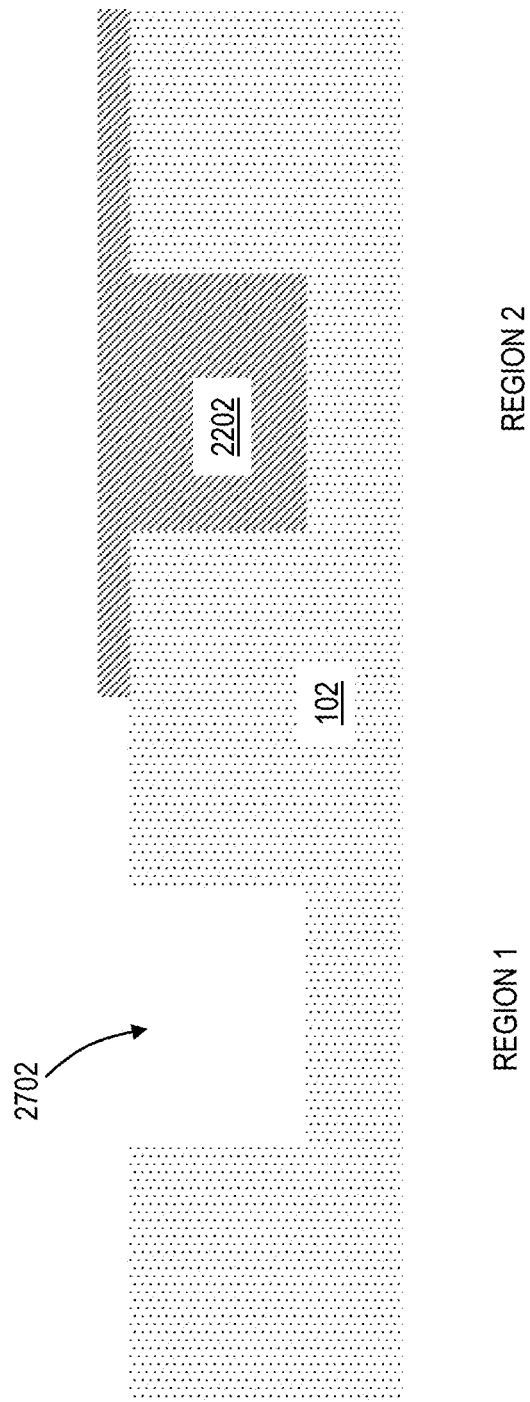
FIG. 28 depicts a cross-sectional view of a portion of an IC under-fabrication after fabrication operations according to one or more embodiments of the invention.

FIG. 27 depicts a cross-sectional view of a portion of the IC 2200 after fabrication operations according to one or more embodiments of the invention. FIG. 27 illustrates further etching to remove first material layer 2202 from region 1, thereby leaving cavity 2702 in region 1. FIG. 28 depicts a cross-sectional view of a portion of the IC 2200 after fabrication operations according to one or more embodiments of the invention. FIG. 28 illustrates removal of block layer 1302.

Figure 30:
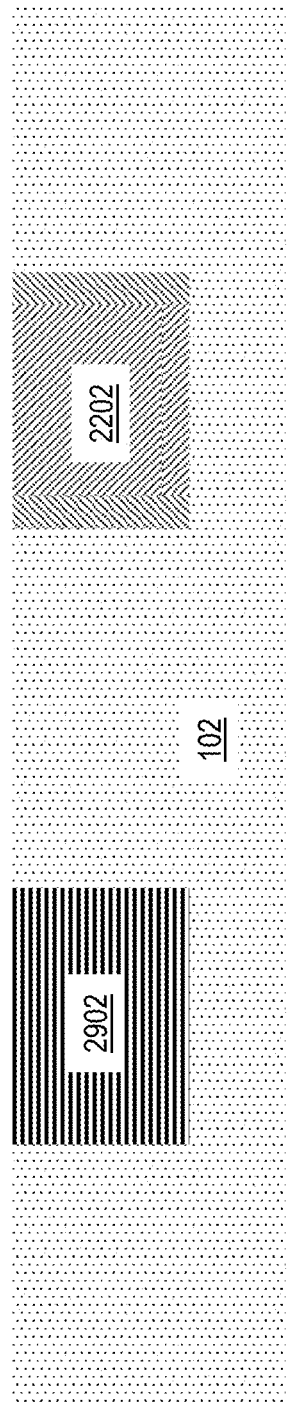
FIG. 30 depicts a cross-sectional view of a portion of an IC under-fabrication after fabrication operations according to one or more embodiments of the invention.

FIG. 29 depicts a cross-sectional view of a portion of the IC 2200 after fabrication operations according to one or more embodiments of the invention. FIG. 29 illustrates deposition of second material layer 2902. Second material layer 2902 can include metals, metallic materials, and/or any conductive material. As noted above, second material layer 2902 is a different material from first material layer 2202. FIG. 30 depicts a cross-sectional view of a portion of the IC 2200 after fabrication operations according to one or more embodiments of the invention. In FIG. 30, etch back is performed to recess first material layer 2202 and second material layer 2902, so as to be coplanar.

Figure 31:
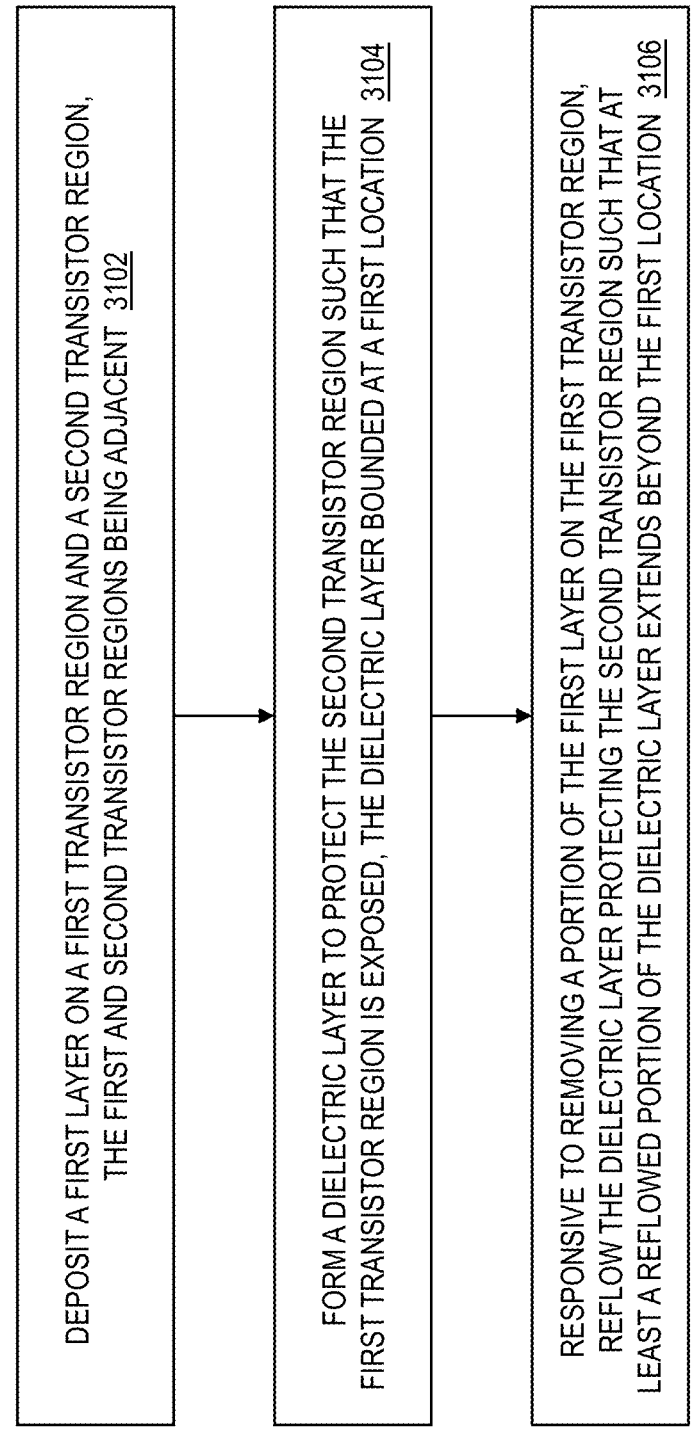
FIG. 31 is a flowchart of a method for a dielectric reflow technique for boundary control according to one or more embodiments of the invention.

FIG. 31 is a flowchart of a method 3100 for a dielectric reflow technique for boundary control according to one or more embodiments of the invention. Reference can made where appropriate to FIGS. 1A-12. At block 3102, the method 3100 includes depositing a first layer (e.g., work function material 104) on a first transistor region and a second transistor region (e.g., NFET and PFET regions), the first and second transistor regions being adjacent. At block 3104, the method 3100 includes forming a dielectric layer (e.g., dielectric layer 202) to protect the second transistor region (e.g., PFET region) such that the first transistor region (e.g., NFET region) is exposed, the dielectric layer (e.g., dielectric layer 202) bounded at a first location, as depicted in FIGS. 2 and 8. At block 3106, the method 3100 includes responsive to removing a portion of the first layer on the first transistor region (e.g., as depicted in FIGS. 3 and 11), reflowing the dielectric layer (e.g., dielectric layer 202) protecting the second transistor region such that at least a reflowed portion (e.g., extended reflowed portions 402, 1002) of the dielectric layer extends beyond the first location, as depicted in FIGS. 4 and 10.

The reflowed portion extends beyond the first location toward the first transistor region, as depicted in FIGS. 4 and 10. The reflowed portion at least covers a footing of the first layer (e.g., a bottom/lower portion of work function material 104) on the second transistor region, as depicted in FIGS. 4 and 10. The first layer is deposited over channel structures (e.g., nanosheet layers 112, 122 and fins 712, 722) in the first and second transistor regions. Additionally, the method includes removing a remainder of the first layer on the first transistor region, as depicted in FIGS. 5 and 11. The method includes removing the dielectric layer, responsive to removing a remainder of the first layer on the first transistor region, and depositing a second layer on the first and second transistor regions, as depicted in FIGS. 5, 6, 11, 12.

The first transistor region corresponds to an n-type field-effect transistor (NFET). The second transistor region corresponds to a p-type field-effect transistor (PFET). The first layer comprises a p-type work function material (e.g., work function material 104). A second layer is applied to the first and second transistor regions, the second layer comprising an n-type work function material (e.g., work function material 602).

Figure 32:
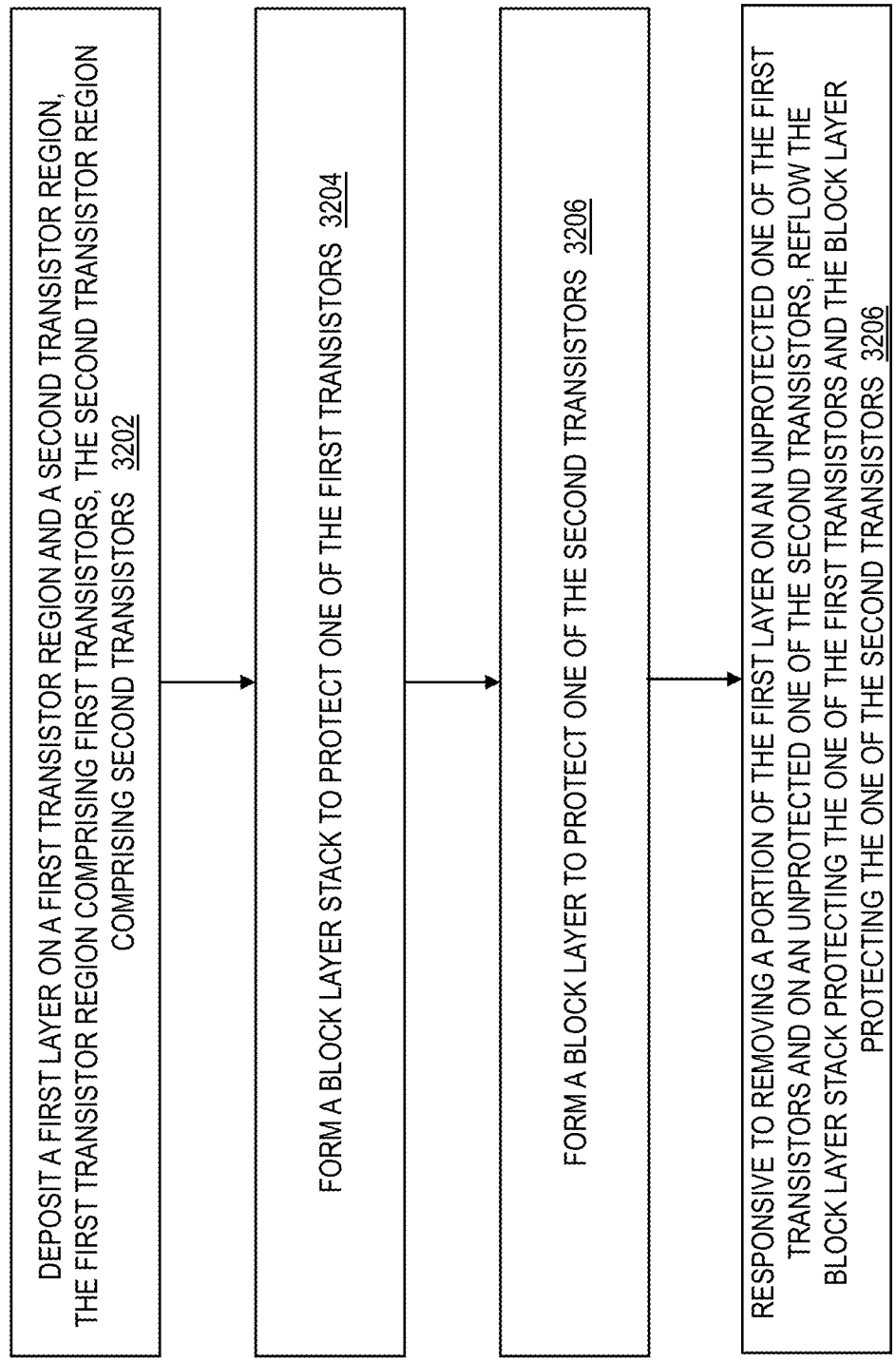
FIG. 32 is a flowchart of a method for a dielectric reflow technique for boundary control according to one or more embodiments of the invention.

FIG. 32 is a flowchart of a method 3200 for a dielectric reflow technique for boundary control according to one or more embodiments of the invention. Reference can made where appropriate to FIGS. 13A-21. At block 3202, the method 3200 includes depositing a first layer (e.g., work function material 104) on a first transistor region and a second transistor region (e.g., wafer regions 1, 2), the first transistor region comprising first transistors (e.g., NFET and PFET in wafer region 1), the second transistor region comprising second transistors (e.g., NFET and PFET in wafer region 2). At block 3204, the method 3200 includes depositing a first layer (e.g., work function material 104) on a first transistor region and a second transistor region (e.g., wafer regions 1, 2), the first transistor region comprising first transistors (e.g., NFET and PFET), the second transistor region comprising second transistors (e.g., NFET and PFET). At blocks 3206, 3208, the method 3200 includes forming a block layer stack (e.g., block layer 1302, 1502) to protect one of the first transistors and forming a block layer (e.g., block layer 1502) to protect one of the second transistors. At block 3210, the method 3200 includes responsive to removing a portion of the first layer on an unprotected one of the first transistors and on an unprotected one of the second transistors (e.g., as depicted in FIG. 17), reflowing the block layer stack (e.g., block layer 1302, 1502) protecting the one of the first transistors and the block layer (e.g., block layer 1502) protecting the one of the second transistors (e.g., as depicted in FIG. 18).

A reflowed portion (e.g., reflowed portion 1802) of the block layer stack extends from the one of the first transistors (e.g., PFET in wafer region 1) toward the unprotected one of the first transistors (e.g., NFET in wafer region 1) in the first transistor region. A reflowed portion (e.g., reflowed portion 1804) of the block layer extends from the one of the second transistors (e.g., PFET in wafer region 2) toward the unprotected one of the second transistors (e.g., NFET in wafer 2) in the second transistor region.

A pitch (e.g., spacing) between the first transistors is different from a pitch between the second transistors. Reflowing the block layer and the block layer stack is configured to accommodate different pitches, as depicted in FIG. 18. The method includes removing a remainder of the first layer on the unprotected one of the first transistors and on the unprotected one of the second transistors, as depicted in FIG. 19.

The method includes removing the block layer and the block layer stack, responsive to removing a remainder of the first layer on the unprotected one of the first transistors and on the unprotected one of the second transistors, and depositing a second layer on the first and second transistors, as depicted in FIGS. 20, 21. The block layer stack comprises a first material (e.g., block layer 1302) and a second material (e.g., block layer 1502) stacked on the first material, the block layer comprising the second material (e.g., block layer 1502).

Figure 33:
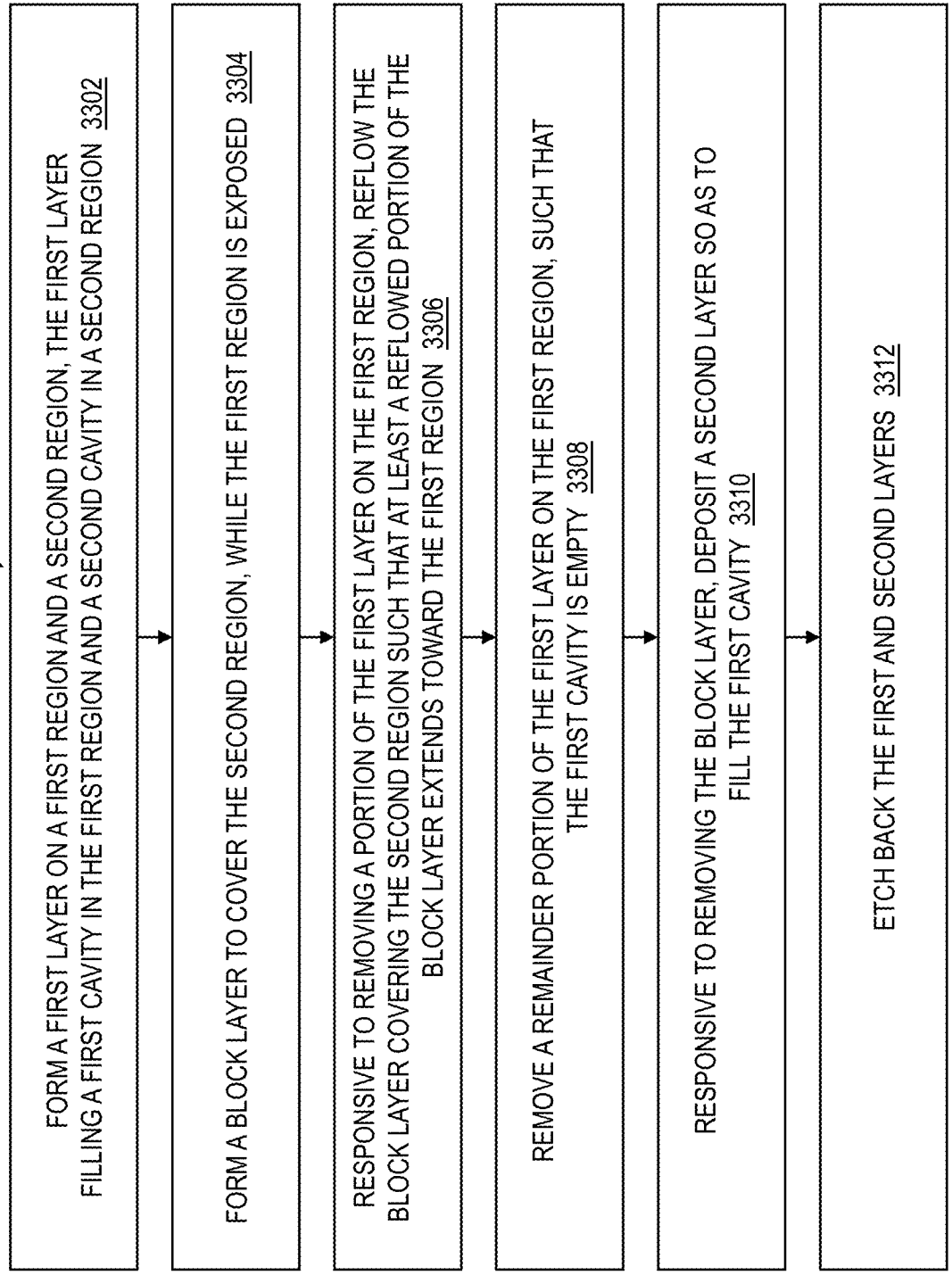
FIG. 33 is a flowchart of a method for a dielectric reflow technique for boundary control according to one or more embodiments of the invention.

FIG. 33 is a flowchart of a reflow method 3300 for a dielectric reflow technique for boundary control according to one or more embodiments of the invention. Reference can made where appropriate to FIGS. 22-30. At block 3302, the method 3300 includes forming a first layer on a first region (e.g., region 1) and a second region (e.g., region 2), the first layer filling a first cavity in the first region and a second cavity in a second region. At block 3304, the method 3300 includes forming a block layer (e.g., block layer 1302) to cover the second region, while the first region is exposed, as depicted in FIG. 24. At block 3306, the method 3300 includes responsive to removing a portion of the first layer on the first region (e.g., as depicted in FIG. 25), reflowing the block layer covering the second region such that at least a reflowed portion (e.g., reflowed portion 2602) of the block layer extends toward the first region. At block 3308, the method 3300 includes removing a remainder portion of the first layer on the first region, such that the first cavity is empty, as depicted in FIG. 27. At blocks 3310, 3312, the method 3300 includes responsive to removing the block layer, depositing a second layer so as to fill the first cavity, and etching back the first and second layers, as depicted in FIGS. 29, 30. The first layer and second layer comprise different materials.

FIG. 34 is a block diagram of a system 3400 according to embodiments of the invention. The system 3400 includes processing circuitry 3410 used to generate the design 3430 that is ultimately fabricated into an integrated circuit 3420, which can include a variety of active semiconductor devices (e.g., NFET and PFET devices along with metal/conductive lines). The steps involved in the fabrication of the integrated circuit 3420 are well-known and briefly described herein. Once the physical layout 3440 is finalized, based, in part, on ICs 100, 700, 1300, 2200 and combinations of the same according to embodiments of the invention, the finalized physical layout 3440 is provided to a foundry. Masks are generated for each layer of the integrated circuit based on the finalized physical layout. Then, the wafer is processed in the sequence of the mask order. The processing includes photolithography and etch. This is further discussed with reference to FIG. 35.

Figure 35:
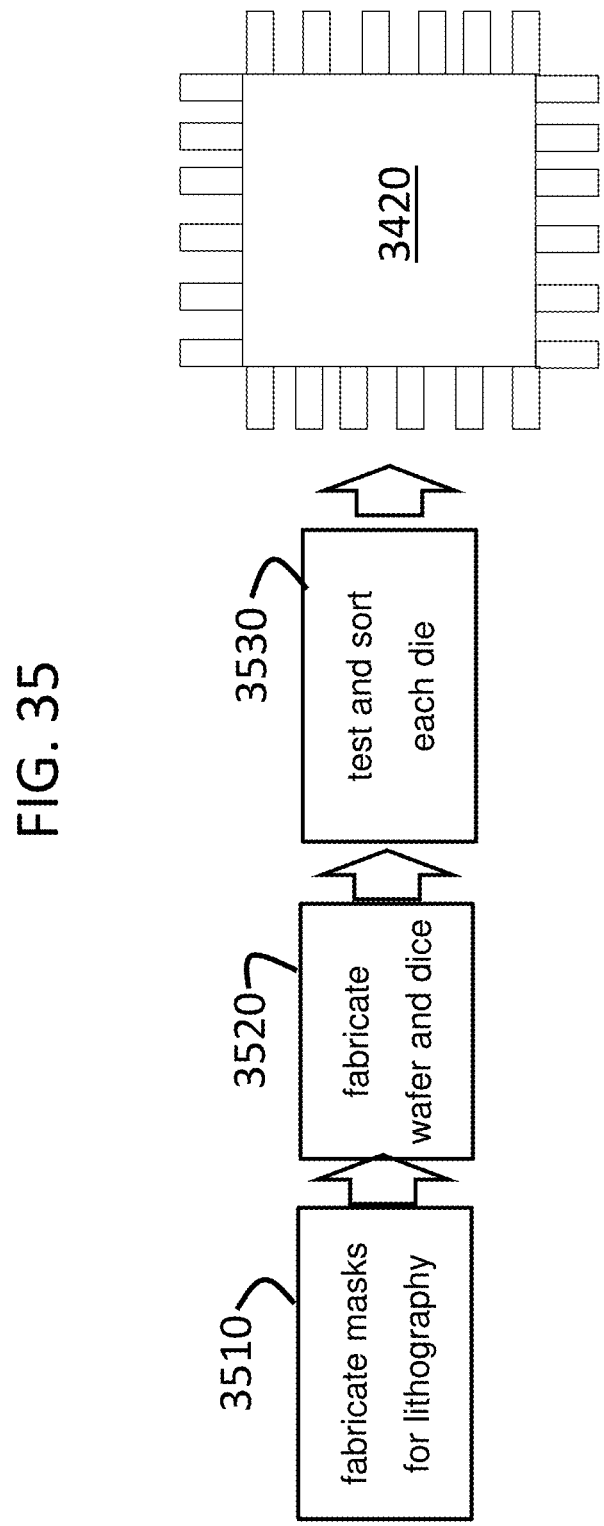
FIG. 35 is a process flow of a method of fabricating the IC of FIG. 34 in accordance with one or more embodiments of the present invention.

FIG. 35 is a process flow of a method of fabricating the integrated circuit according to exemplary embodiments of the invention. Once the physical design data is obtained, based, in part, ICs 100, 700, 1300, 2200 and combinations of the same, the integrated circuit 3420 can be fabricated according to known processes that are generally described with reference to FIG. 35. Generally, a wafer with multiple copies of the final design is fabricated and cut (i.e., diced) such that each die is one copy of the integrated circuit 3420. At block 3510, the processes include fabricating masks for lithography based on the finalized physical layout. At block 3520, fabricating the wafer includes using the masks to perform photolithography and etching. Once the wafer is diced, testing and sorting each die is performed, at block 3530, to filter out any faulty die.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The phrase "selective to," such as, for example, "a first element selective to a second element," means that the first element can be etched and the second element can act as an etch stop.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

As noted above, atomic layer etching processes can be used in the present invention for via residue removal, such as can be caused by via misalignment. The atomic layer etch process provide precise etching of metals using a plasma-based approach or an electrochemical approach. The atomic layer etching processes are generally defined by two well-defined, sequential, self-limiting reaction steps that can be independently controlled. The process generally includes passivation followed selective removal of the passivation layer and can be used to remove thin metal layers on the order of nanometers. An exemplary plasma-based approach generally includes a two-step process that generally includes exposing a metal such a copper to chlorine and hydrogen plasmas at low temperature (below 20° C.). This process generates a volatile etch product that minimizes surface contamination. In another example, cyclic exposure to an oxidant and hexafluoroacetylacetone (Hhfac) at an elevated temperature such as at 275° C. can be used to selectively etch a metal such as copper. An exemplary electrochemical approach also can include two steps. A first step includes surface-limited sulfidization of the metal such as copper to form a metal sulfide, e.g., $Cu_2S$, followed by selective wet etching of the metal sulfide, e.g., etching of $Cu_2S$ in HCl. Atomic layer etching is relatively recent technology and optimization for a specific metal is well within the skill of those in the art. The reactions at the surface provide high selectivity and minimal or no attack of exposed dielectric surfaces.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The photoresist can be formed using conventional deposition techniques such chemical vapor deposition, plasma vapor deposition, sputtering, dip coating, spin-on coating, brushing, spraying and other like deposition techniques can be employed. Following formation of the photoresist, the photoresist is exposed to a desired pattern of radiation such as X-ray radiation, extreme ultraviolet (EUV) radiation, electron beam radiation or the like. Next, the exposed photoresist is developed utilizing a conventional resist development process.

After the development step, the etching step can be performed to transfer the pattern from the patterned photoresist into the interlayer dielectric. The etching step used in forming the at least one opening can include a dry etching process (including, for example, reactive ion etching, ion beam etching, plasma etching or laser ablation), a wet chemical etching process or any combination thereof.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e., two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method comprising:
   depositing a first layer on a first transistor region and a second transistor region, the first and second transistor regions being adjacent;
   forming a dielectric layer to protect the second transistor region such that the first transistor region is exposed, the dielectric layer bounded at a first location;
   removing a portion of the first layer on the first transistor region such that the portion removed undercuts the dielectric layer and leaves a gap under the dielectric layer; and
   reflowing the dielectric layer protecting the second transistor region such that at least a reflowed portion of the dielectric layer extends beyond the first location and fills in the gap.

2. The method of claim 1, wherein the reflowed portion extends beyond the first location toward the first transistor region.

3. The method of claim 1, wherein the reflowed portion at least covers a footing of the first layer on the second transistor region.

4. The method of claim 1, wherein the first layer is deposited over channel structures in the first and second transistor regions.

5. The method of claim 1 further comprising removing a remainder of the first layer on the first transistor region.

6. The method of claim 1 further comprising:
   removing the dielectric layer, responsive to removing a remainder of the first layer on the first transistor region; and
   depositing a second layer on the first and second transistor regions.

7. The method of claim 1, wherein the first transistor region corresponds to an n-type field-effect transistor (NFET).

8. The method of claim 1, wherein the second transistor region corresponds to a p-type field-effect transistor (PFET).

9. The method of claim 1, wherein the first layer comprises a p-type work function material.

10. The method of claim 1, wherein a second layer is applied to the first and second transistor regions, the second layer comprising an n-type work function material.

* * * * *